US012756160B2

(12) United States Patent
Koyama et al.

(10) Patent No.: US 12,756,160 B2
(45) Date of Patent: Oct. 6, 2026

(54) SURFACE EMITTING LASER

(71) Applicant: TOKYO INSTITUTE OF TECHNOLOGY, Tokyo (JP)

(72) Inventors: Fumio Koyama, Tokyo (JP); Hameeda Ibrahim, Tokyo (JP); Xiaodong Gu, Tokyo (JP); Ahmed Hassan, Tokyo (JP)

(73) Assignee: INSTITUTE OF SCIENCE TOKYO, Tokyo (JP)

( * ) Notice: Subject to any disclaimer, the term of this patent is extended or adjusted under 35 U.S.C. 154(b) by 798 days.

(21) Appl. No.: 17/354,352

(22) Filed: Jun. 22, 2021

(65) Prior Publication Data

US 2022/0085573 A1 Mar. 17, 2022

(30) Foreign Application Priority Data

Jun. 22, 2020 (JP) ................................ 2020-106983
Jun. 14, 2021 (JP) ................................ 2021-098801

(51) Int. Cl.
*H01S 5/183* (2006.01)

(52) U.S. Cl.
CPC ...... *H01S 5/18394* (2013.01); *H01S 5/18308* (2013.01)

(58) Field of Classification Search
CPC ....... H01S 5/142; H01S 5/1811–18313; H01S 5/1021; H01S 5/183–18397
See application file for complete search history.

(56) References Cited

U.S. PATENT DOCUMENTS

| | | | | |
|---|---|---|---|---|
| 6,549,556 B1 * | 4/2003 | Hwang | H01S 5/18341 | 372/96 |
| 6,751,245 B1 * | 6/2004 | Wasserbauer | H01S 5/18341 | 372/96 |
| 6,901,099 B1 * | 5/2005 | Wasserbauer | H01S 5/18327 | 372/99 |
| 7,564,887 B2 * | 7/2009 | Wang | H01S 5/18327 | 372/92 |
| 10,658,815 B1 | 5/2020 | Dalir et al. | | |
| 2015/0043605 A1 * | 2/2015 | Koyama | H01S 5/18313 | 372/50.1 |

(Continued)

FOREIGN PATENT DOCUMENTS

| | | |
|---|---|---|
| JP | 2006140446 A | 6/2006 |
| JP | 2007103544 A | 4/2007 |

(Continued)

OTHER PUBLICATIONS

Scott, WO-0195443-A1 (Year: 2001).*

(Continued)

*Primary Examiner* — Minsun O Harvey
*Assistant Examiner* — Fernanda Adriana Camacho Alanis
(74) *Attorney, Agent, or Firm* — CANTOR COLBURN LLP

(57) ABSTRACT

A surface emitting laser has a Vertical-Cavity Surface emitting laser (VCSEL) structure. The VCSEL structure includes an aperture provided by a current confinement structure. An optically discontinuous portion is formed in a top Distributed Bragg Reflector (DBR) of the VCSEL structure such that it is arranged in a region with a gap between it and the aperture.

17 Claims, 29 Drawing Sheets

(56) References Cited

U.S. PATENT DOCUMENTS

| | | | | |
|---|---|---|---|---|
| 2015/0280402 | A1* | 10/2015 | Gubenko | H01S 5/34313 372/50.11 |
| 2018/0059586 | A1* | 3/2018 | Kondo | H01S 5/183 |
| 2018/0070423 | A1* | 3/2018 | Kondo | H01S 5/04256 |
| 2019/0140423 | A1* | 5/2019 | Westbergh | H01S 5/04254 |
| 2020/0119521 | A1* | 4/2020 | Feng | H01S 5/065 |
| 2020/0363596 | A1* | 11/2020 | Hashiya | G02F 1/292 |

FOREIGN PATENT DOCUMENTS

| | | | | |
|---|---|---|---|---|
| JP | 2013201222 | A | 10/2013 | |
| JP | 2014022667 | A | 2/2014 | |
| JP | 6240429 | B2 | 11/2017 | |
| JP | 2018041771 | A | 3/2018 | |
| JP | 2018098340 | A | 6/2018 | |
| WO | WO-0195443 | A1 * | 12/2001 | H01S 5/18341 |

OTHER PUBLICATIONS

JPO Notification of Reason(s) for Refusal for corresponding JP Application No. 2021-098801; Issued Jul. 8, 2025.

JPO Notification of Reason(s) for Refusal for corresponding JP Application No. 2021-098802, Issued Apr. 15, 2025.

Ibrahim et al., "High-speed Double Transverse Coupled Cavity VCSELs", 2019; 12-302; p. 13.8.

JPO Notification of Reason(s) for Refusal for corresponding JP Application No. 2021-098801; Issued Apr. 22, 2025.

JPO Decision of Dismissal of Amendment for corresponding JP Application No. 2021-098801; Issued Sep. 24, 2025.

JPO Decision of Refusal for corresponding JP Application No. 2021-098881; issued Sep. 24, 2025.

JPO Notice of Reasons for Refusal for corresponding JP Application No. 2025-128232; issued May 18, 2026.

* cited by examiner

SURFACE EMITTING LASER

CROSS REFERENCE TO RELATED APPLICATIONS

The present invention claims priority under 35 U.S.C. § 119 to Japanese Application No. 2020-106983, filed Jun. 22, 2020 and Japanese Application No. 2021-098801, filed Jun. 14, 2021; the entire contents of which is incorporated herein by reference.

BACKGROUND

1. Technical Field

The present disclosure relates to a surface emitting semiconductor laser.

2. Description of the Related Art

With conventional surface emitting lasers, the single-mode output has been limited to the mW level. If such a surface emitting laser could be improved to be capable of providing watt-class high-power output, this would allow various kinds of applications to be developed. Examples of such applications include: wavelength scanning light sources for optical coherence tomography (OCT); light sources for medium-distance to long-distance optical communication; laser radar (LIDAR) light sources to be mounted on a vehicle, drone, robot, or the like; monitoring systems; automatic inspection apparatuses employed at a manufacturing site; laser dryers employed in a printer; etc.

A Vertical-Cavity Surface Emitting Laser (VCSEL) including a main resonator and an external resonator coupled in the transverse direction is disclosed in Patent document 1 (Japanese Patent Application No. 6,240,429). In this technique, the main resonator and the external resonator have the same cross-sectional structure. Accordingly, the main resonator and the external resonator have the same resonator length, i.e., provide the same resonance wavelength.

With the VCSEL according to Patent document 1, light is fed back from the external resonator to the main resonator, thereby providing high-speed modulation.

As a result of investigating the VCSEL described in Patent document 1, the present inventors have recognized the following problems.

The VCSEL disclosed in Patent document 1 allows the bandwidth to be extended as compared with an arrangement including no external resonator. This allows high-speed modulation to be supported. However, the main resonator and the external resonator provide substantially the same resonance wavelength (specifically, with a wavelength difference $\Delta\lambda$ on the order of 1 nm). This leads to a problem in that single-mode oscillation is unstable. Also, there is room for further improvement from the viewpoint of reducing the noise level. Furthermore, in order to support single-mode oscillation, an oxidized current confinement structure is required to have an opening reduced in size on the order of a few μm. Such an arrangement has a significant problem of poor reliability when the current density becomes large.

SUMMARY

The present disclosure has been made in view of such a situation. One of the purposes is to provide a surface emitting laser with an improved modulation bandwidth. Another purpose is to realize single-mode operations for relatively large oxide apertures. Additionally, it is to improve noise characteristics.

An embodiment of the present disclosure relates to a surface emitting laser. The surface emitting laser includes: a Vertical-Cavity Surface Emitting Laser (VCSEL) structure having a top Distributed Bragg Reflector (DBR) and an aperture provided by a current confinement structure; and an optically discontinuous portion formed in the top DBR, wherein the optically discontinuous portion is arranged apart from the oxide aperture in a transverse direction.

It should be noted that, in the present specification, the upper-lower direction, the transverse direction, the horizontal direction, and the vertical direction are defined for convenience, and have no relation with the directions in the actual operation.

It is to be noted that any arbitrary combination or rearrangement of the above-described structural components and so forth is effective as and encompassed by the present embodiments. Moreover, this summary does not necessarily describe all necessary features so that the disclosure may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of the Embodiments

Figure 1:
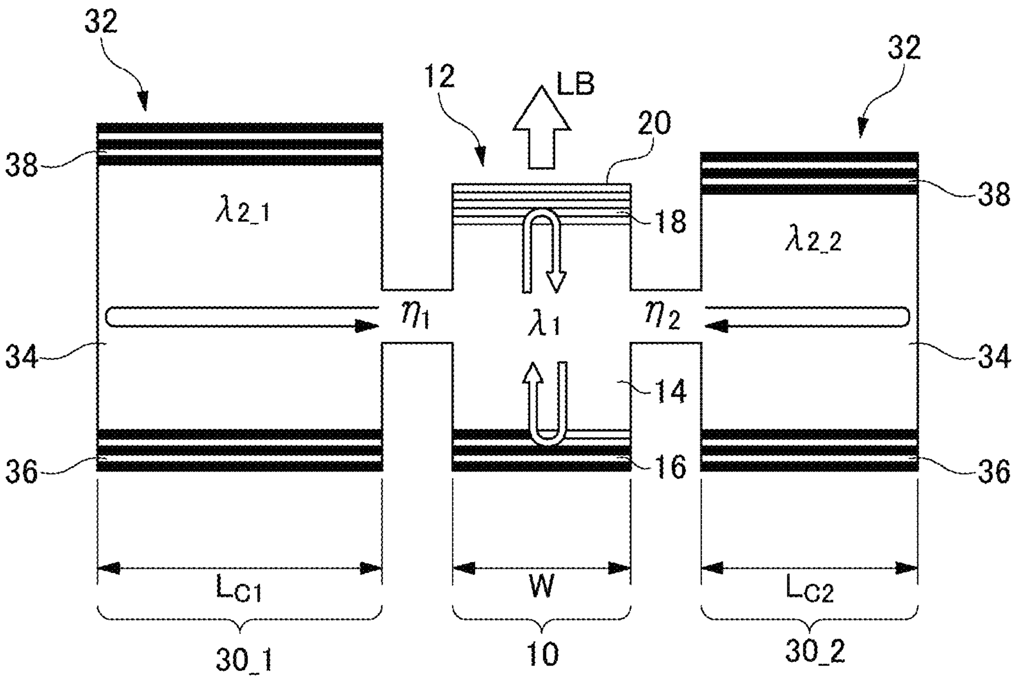
FIG. 1 is a schematic diagram showing a surface emitting laser according to an embodiment 1.

An outline of several example embodiments of the disclosure follows. This summary is provided for the convenience of readers to provide their basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

A surface emitting laser according to one embodiment includes: a Vertical-Cavity Surface Emitting Laser (VCSEL) structure having a top Distributed Bragg Reflector (DBR) and an aperture provided by a current confinement structure; and an optically discontinuous portion formed in the top DBR. The optically discontinuous portion is arranged apart from the oxide aperture in the transverse direction.

A portion that overlaps with the aperture functions as a main resonator. A region interposed between the aperture and the optically discontinuous portion functions as an external resonator (sub-cavity). The light in the external resonator is turned back to the direction of the main resonator due to a discontinuity on a side of the optically discontinuous portion. As a result, the slow light is fed back from the external resonator to the main resonator. This allows the modulation bandwidth to be extended, thereby allowing the modulation frequency to be raised.

Directing attention to the light propagation in the transverse direction, the light does not propagate in the oxidized region. Instead, light leaks as evanescent light. Accordingly, with one embodiment, the distance between the side of the aperture and the side of the optically discontinuous portion may be shorter than 3 μm. In one embodiment, the distance between the side of the aperture and the side of the optically discontinuous portion may be equal to or smaller than 2 μm. This allows the light to be effectively fed back from the external resonator to the main resonator.

In one embodiment, the optically discontinuous portion may be formed of a metal material. With such an arrangement using the discontinuity of the optical characteristics at the boundary of the metal, this allows the light to be turned back toward the main resonator.

With one embodiment, the optically discontinuous portion may be configured as a p-type electrode for injecting a current to the VCSEL structure. With this arrangement in which the shape and the layout of the p-type electrode are appropriately designed while maintaining the same basic structure as an ordinary surface emitting laser, this provides high-speed operation.

In one embodiment, the optically discontinuous portion may be formed of a dielectric material. With such an arrangement using the discontinuity of the optical characteristics at the boundary of the dielectric material, this allows the light to be reflected to the main resonator. The dielectric material is transparent. Accordingly, with such an arrangement in which the optically discontinuous portion is formed of a dielectric material, this allows a larger amount of light to be output in the upper direction as compared with an arrangement in which the optically discontinuous portion is formed of a metal material.

In one embodiment, the optically discontinuous portion may be formed of $Ta_2O_5$ or $Si_xN_y$.

In one embodiment, the optically discontinuous portion may be formed of a semiconductor material. With such an arrangement using the discontinuity of the optical characteristics at the boundary of the semiconductor material, this allows the light to be turned back to the main resonator. The semiconductor material is transparent. Accordingly, with such an arrangement in which the optically discontinuous portion is formed of a semiconductor material, this allows a larger amount of light to be output as compared with an arrangement in which the optically discontinuous portion is formed of a metal material.

In one embodiment, the semiconductor material may be GaAs or Si.

In one embodiment, the top DBR may have a multilayer structure including a semiconductor DBR and a dielectric DBR. Also, the optically discontinuous portion may be formed at a boundary between the semiconductor DBR and the dielectric DBR.

In one embodiment, the optically discontinuous portion may be structured as an oxidation layer. With such an arrangement using the discontinuity of the optical characteristics at the boundary of the oxidized layer, this allows the light to be turned back to the main resonator.

In one embodiment, the VCSEL structure may include a first oxidation current confinement layer in which the aperture is to be formed, and a second oxidation current confinement layer formed above the first oxidation current confinement layer. Also, the optically discontinuous portion may be formed in the second oxidation current confinement layer. With this, the external resonator can be formed using an oxidized current confinement structure.

In one embodiment, multiple optically discontinuous portions may be formed in different directions with respect to the aperture. In this case, multiple external resonators are formed corresponding to the multiple optically discontinuous portions. With this, the slow light is fed back to the main resonator from the multiple external resonators. Accordingly, this allows the modulation bandwidth to be further extended as compared with an arrangement provided with a single external resonator.

The multiple external resonators may have different sizes. With this, the phase of the slow light to be fed back can be optimized for each external resonator using the size of each external resonator as a parameter. In a case in which each external resonator has a rectangular shape, the size of each external resonator can be regarded as a combination of the resonator length defined in the slow light propagation direction and the width orthogonal to the resonator length. In a case in which the external resonator has a circular shape, the size of the external resonator can be regarded as a radius thereof. In a case in which the external resonator has a square shape having a diagonal extending in the slow light propagation direction, the size of the external resonator can be regarded as the length of the diagonal. In a case in which the main resonator or the external resonator has an oxidized current confinement structure, the size is defined based on the oxidation aperture diameter.

The multiple external resonators may have different respective coupling coefficients with the main resonator. With this, the intensity of the slow light to be fed back (i.e., feedback ratio) can be optimized for each external resonator using the coupling coefficient thereof as a parameter.

The multiple external resonators and the main resonator may have different sizes in the transverse direction. This provides stable single-mode oscillation even in a case in which the main resonator has a large size. This provides high-output operation, high reliability, and low noise characteristics.

EMBODIMENTS

Description will be made below regarding preferred embodiments with reference to the drawings. In each drawing, the same or similar components, materials, and processes are denoted by the same reference numerals, and redundant description thereof will be omitted as appropriate. The embodiments have been described for exemplary purposes only, and are by no means intended to restrict the present disclosure. Also, it is not necessarily essential for the present disclosure that all the features or a combination thereof be provided as described in the embodiments.

Embodiment 1

FIG. 1 is a schematic diagram showing a surface emitting laser 1A according to an embodiment 1. The surface emitting laser 1A includes a main resonator 10 and multiple external resonators 30. FIG. 1 shows an example including two external resonators 30, which are denoted by 30_1 and 30_2, respectively.

The main resonator 10 has a Vertical-Cavity Surface Emitting Laser (VCSEL) structure 12, and includes an electrode for RF signal (not shown) and an output window 20 that allows a laser beam LB to be output. The VCSEL structure 12 includes an active layer 14, a bottom Distributed Bragg Reflector (DBR) 16, and a top DBR 18.

The external resonators 30_1 and 30_2 both have a VCSEL structure 32. The VCSEL structure 32 includes an active layer 34, a bottom DBR 36, and a top DBR 38. The active layer 34 of the VCSEL structure 32 is formed such that it is continuous with the active layer 14 of the VCSEL structure 12. The external resonators 30_1 and 30_2 are coupled to the main resonator 10 in the transverse direction.

The coupling coefficient between the main resonator 10 and the external resonator 30_1 is represented by $\eta_1$, and the coupling coefficient between the main resonator 10 and the external resonator 30_2 is represented by $\eta_2$. Furthermore, the resonance wavelength of the main resonator 10 is represented by $\lambda_1$. The resonance wavelengths of the external resonators 30_1 and 30_2 are represented by $\lambda_{2\_1}$ and $\lambda_{2\_2}$, respectively. Furthermore, the size of the main resonator 10 is represented by W, and the sizes of the external resonators 30_1 and 30_2 are represented by $L_{c1}$ and $L_{c2}$, respectively.

In an example, at least one from among the resonance wavelengths $\lambda_{2\_1}$ and $\lambda_{2\_2}$ of the external resonators 30_1 and 30_2 is designed to be different from the resonance wavelength $\lambda_1$ of the main resonator 10. Preferably, the relation $\lambda_{2\_1}, \lambda_{2\_2} > \lambda_1$ holds true. More preferably, the difference $\Delta\lambda_1$ between $\lambda_{2\_1}$ and $\lambda_1$ and the difference $\Delta\lambda_2$ between $\lambda_{2\_2}$ and $\lambda_1$ may be larger than 3 nm, on the order of 5 nm, or larger than 5 nm. In a case in which two or more external resonators 30 are provided as shown in FIG. 1, the relation $\lambda_{2\_1} \neq \lambda_{2\_2} \neq \lambda_1$ may hold true.

In an example, at least one of the sizes $L_{c1}$ and $L_{c2}$ of the external resonators 30_1 and 30_2 may be different from the size W of the main resonator 10 ($L_{c1} \neq W$, $L_{c2} \neq W$). In a case in which two (or more) external resonators 30_1 and 30_2 are provided, the relation $L_{c1} \neq L_{c2}$ may hold true.

In a case in which two or more external resonators 30 are provided, the coupling coefficient with the main resonator 10 may preferably be optimized individually for each external resonator 30. Also, the relation $\eta_1 \neq \eta_2$ may hold true.

The above is the basic configuration of the surface emitting laser 1A. Next, description will be made regarding the operation thereof. First, description will be made regarding the principle of the modulation bandwidth enhancement provided by the external resonator.

Figure 2:
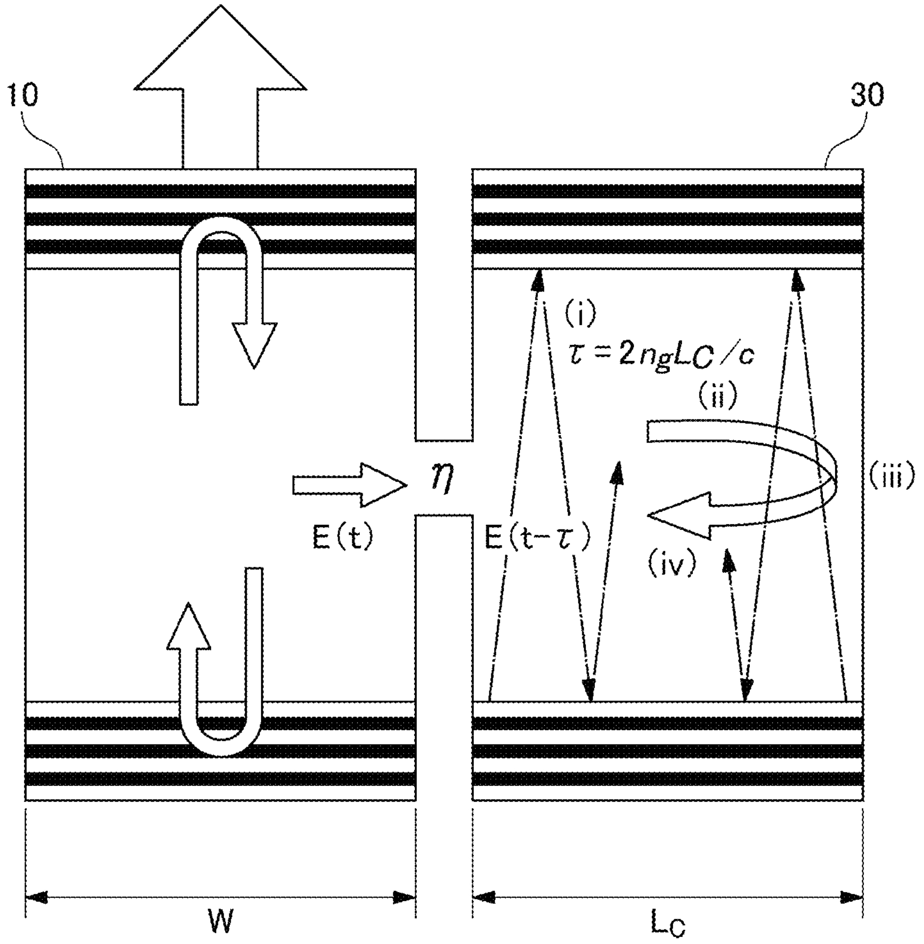
FIG. 2 is a diagram for explaining the operation of the surface emitting laser.

FIG. 2 is a diagram for explaining the operation of the surface emitting laser 1A. For simplification of explanation, description will be made directing attention to only a single external resonator 30.

A modulation signal is applied to an electrode for RF signal of the main resonator 10. Also, a DC current may be applied to a control electrode of the external resonator 30.

The main resonator 10 operates as an ordinary VCSEL. Laser light is amplified in the active layer 34 during a round trip between the bottom DBR 16 and the top DBR 18, and is output in the vertical direction via the output window 20.

The main resonator 10 is coupled with the external resonator 30. Accordingly, a part of the laser light generated in the main resonator 10 leaks to the external resonator 30. Within the external resonator 30, the light thus coupled from the main resonator 10 slowly propagates in a direction indicated by the solid line (ii) while being reflected multiple times between the bottom DBR 36 and the top DBR 38 as indicated by the line of alternately long and short dashes (i) (which is referred to as "slow light propagation"). Subsequently, after the slow light is reflected at an end of the external resonator 30 (*iii*), the slow light returns to the main resonator 10 (*iv*). A part of the returning slow light is fed back to the main resonator 10.

With the electric field injected from the main resonator 10 to the external resonator 30 as E(t), the electric field re-injected from the external resonator 30 to the main resonator 10 can be represented by E(t−τ). Here, τ represents a round-trip delay time from the injection of the light to the external resonator 30 to the return of the light after slow light propagation. Specifically, τ is represented by τ=2●Lc($n_g$/c). Here, $n_g$ represents a group index of the slow light in a medium. Typically, $n_g$>30 holds true.

By feeding back the feedback light E(t−τ) of the slow light having an out-of-phase with respect to the electric field E(t) within the main resonator 10, this allows the effective differential gain of the surface emitting laser 1A itself to be increased. This increases the relaxation oscillation frequency, thereby allowing the bandwidth enhancement. In this case, the coupling coefficient η and the size Lc of the resonator are each employed as a design parameter for the feedback amount and the feedback phase. Accordingly, by individually optimizing the coupling coefficient η and/or the size Lc for each of the multiple external resonators 30, this allows the surface emitting laser 1A itself to have an extended modulation bandwidth. Furthermore, a peak occurs due to the photon-photon resonance effect accompanying the resonance that occurs in each external resonator 30 in the transverse direction. This increases the modulation efficiency in the high-frequency region, with increasing the relaxation oscillation frequency, thereby allowing the modulation bandwidth to be extended.

Figure 3:
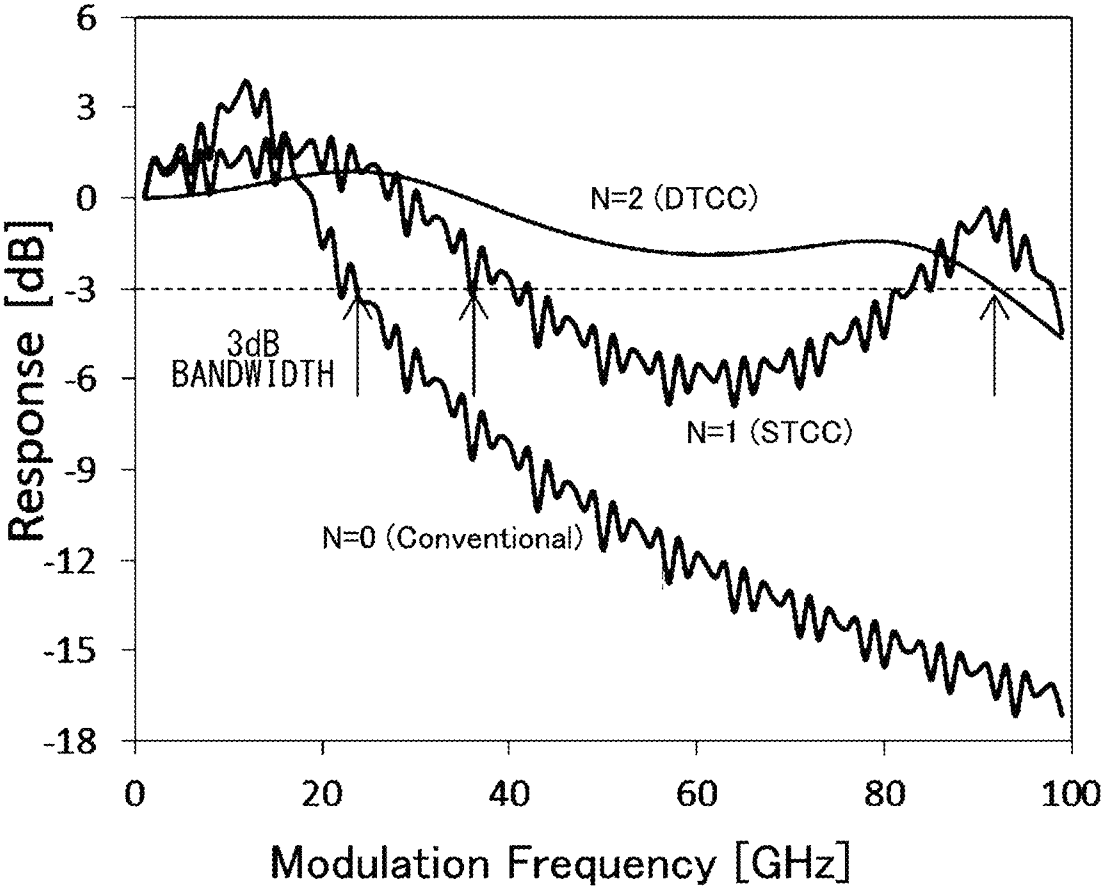
FIG. 3 is a diagram showing the modulation bandwidth (simulation results) of the surface emitting laser.

FIG. 3 is a diagram showing the modulation bandwidth (simulation result) of the surface emitting laser 1A. The horizontal axis represents the frequency (modulation frequency) of the modulation signal supplied to the electrode for RF signal. The vertical axis represents the modulation response. FIG. 3 shows the modulation bandwidths in a case in which the number of the external resonators 30 is set to 0, 1, and 2. In some cases, the surface emitting laser with N=1 is also referred to as Single Transverse Coupled Cavity (STCC), and the surface emitting laser with N=2 is also referred to as Double Transverse Coupled Cavity (DTCC).

The STCC with N=1 is designed with $\lambda_1$=~850 nm, W=4 μm, $L_{c1}$=10 μm, and $\eta_1$=0.96 as its parameters. The DTCC with N=2 is designed with $\lambda_1$=~850 nm, W=4 μm, =7=0.9, $L_{c2}$=8 μm, and $\eta_2$=0.7 as its parameters.

In a case in which N=1, such an arrangement provides a 3 dB bandwidth on the order of 40 GHz. In contrast, an arrangement in which N=2 allows the 3 dB bandwidth to be extended up to 90 GHz. It should be noted that it is not obvious to those experts in this field that an increased number of the external resonators 30 provides an improved modulation bandwidth. This knowledge has been uniquely found by the present inventors.

Figure 4:
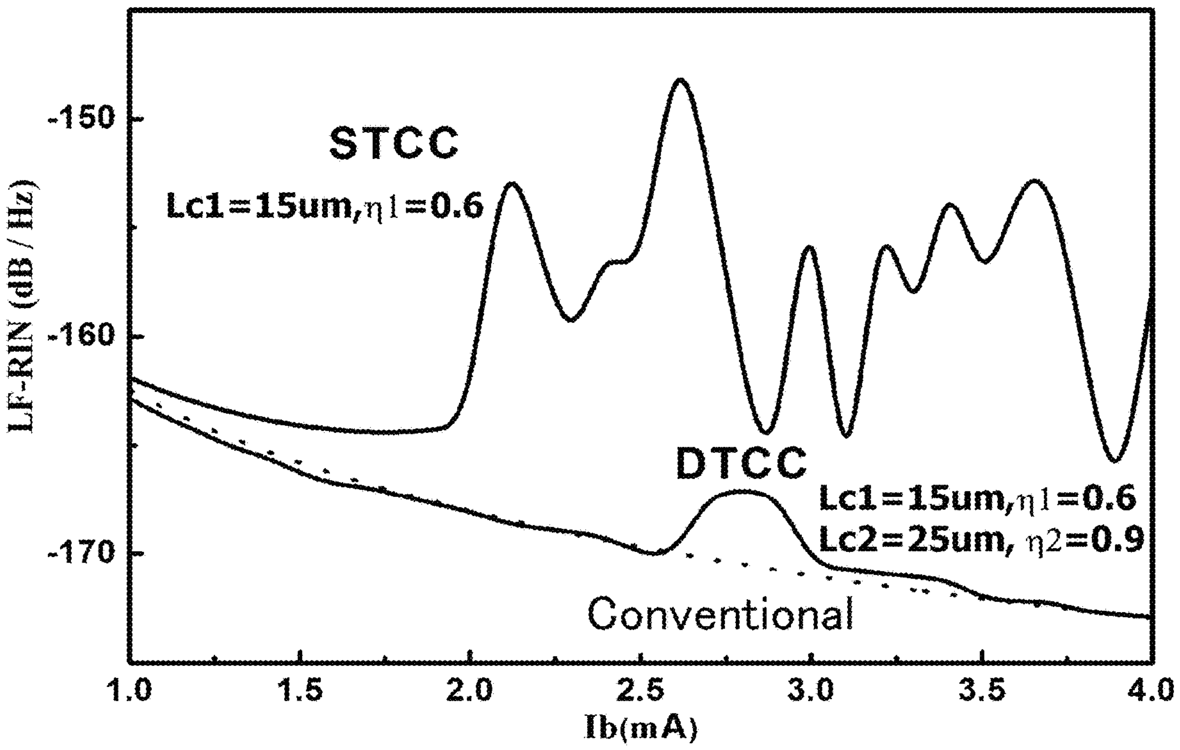
FIG. 4 is a diagram showing the relative intensity noise (simulation results) of the surface emitting laser.

FIG. 4 is a diagram showing a relative intensity noise (simulation result) of the surface emitting laser 1A. The horizontal axis represents the bias current Ib. The STCC with N=1 is designed with $\lambda_1$=850 nm, W=4 μm, $L_{c1}$=15 μm, and $\eta_1$=0.6 as its parameters. The DTCC with N=2 is designed with $\lambda_1$=850 nm, W=4 μm, $L_{c1}$=15 μm, $\eta_1$=0.6, $L_{c2}$=25 μm, and $\eta_2$=0.9 as its parameters. A conventional surface emitting laser with N=0 provides the most favorable noise characteristics. In contrast, the STCC with N=1 provides greatly degraded noise characteristics as compared with the conventional surface emitting laser with N=0. However, the DTCC with N=2 provides equivalently favorable noise characteristics as compared with the conventional surface emitting laser.

Figure 5B:
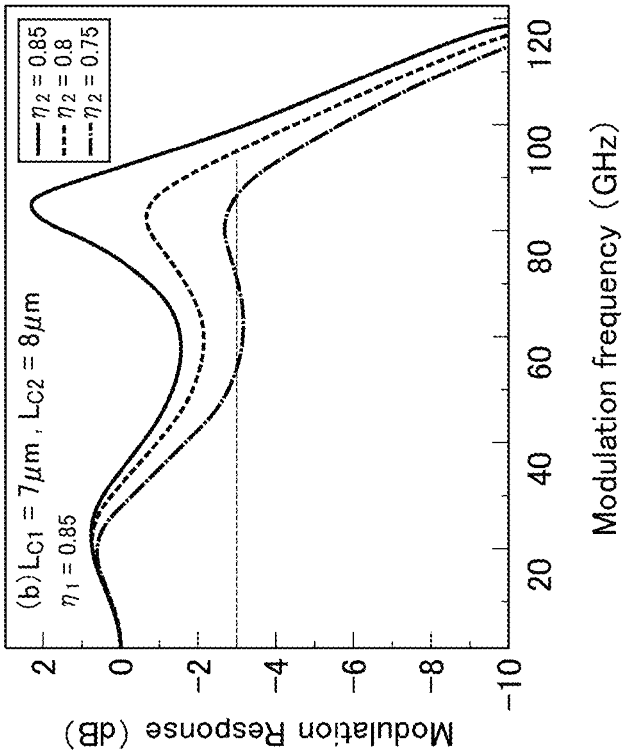
FIGS. 5A and 5B are diagrams showing the modulation bandwidth (simulation results) of the DTCC (Double Transverse Coupled Cavity) surface emitting laser.
Figure 5A:
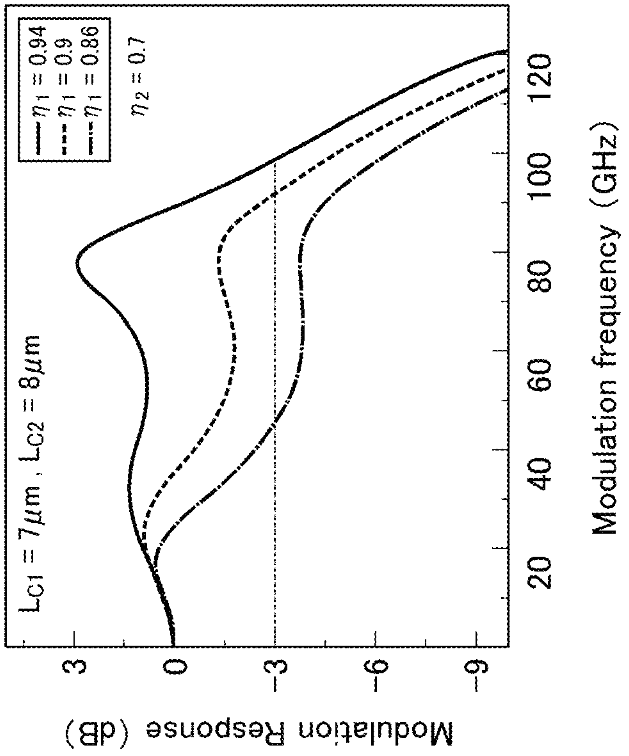

FIGS. 5A and 5B are diagrams each showing the modulation bandwidth of the DTCC (simulation results). FIG. 5A shows the dependence of the coupling coefficient $\eta_1$ between the external resonator 30_1 and the main resonator 10. FIG. 5B shows the dependence of the coupling coefficient $\eta_2$ between the external resonator 30_2 and the main resonator 10. The DTCC is designed with $\lambda_1$=850 nm, W=4 μm, $L_{c1}$=7 μm, and $L_{c2}$=8 μm as its parameters.

As can be understood from FIGS. 5A and 5B, with such an arrangement in which the coupling coefficients $\eta_1$ and $\eta_2$ of the multiple external resonators 30 are individually optimized, this allows the modulation bandwidth to be extended.

Figure 6:
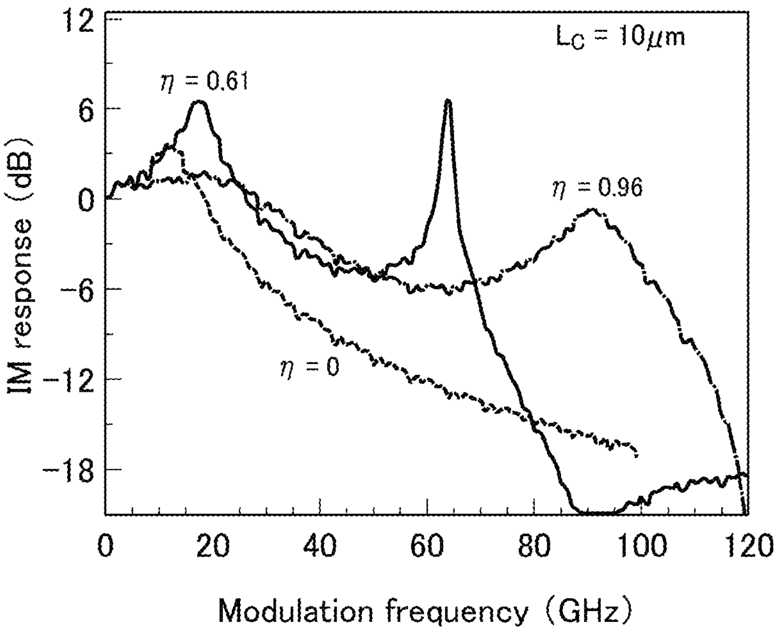
FIG. 6 is a diagram showing the modulation bandwidth (simulation results) of the STCC (Single Transverse Coupled Cavity) surface emitting laser.

FIG. 6 is a diagram showing the modulation bandwidth of the STCC (simulation results). FIG. 6 shows the dependence of the coupling coefficient $\eta_1$ between the external resonator 30 and the main resonator 10. The STCC is designed with $\eta_1$=850 nm, W=4 μm, and $L_c$=10 μm as its parameters. With the STCC, the change of the coupling coefficient $\eta_1$ causes the occurrence of a peak at a particular frequency due to the photon-photon resonance effect. However, such a peak does not sufficiently contribute to the improvement of the 3 db modulation bandwidth. These simulation results support the observation that the STCC has a limitation in the improvement of the modulation bandwidth, and that the DTCC is advantageous as compared with the STCC.

Figure 7B:
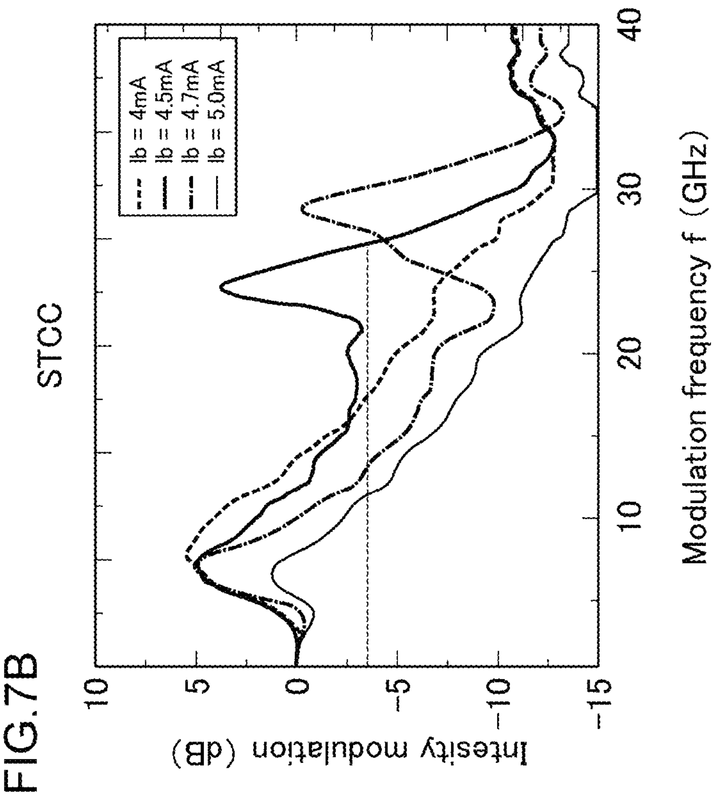
FIGS. 7A and 7B are diagrams showing the measurement results of the modulation bandwidths of DTCC and STCC surface emitting laser samples.
Figure 7A:
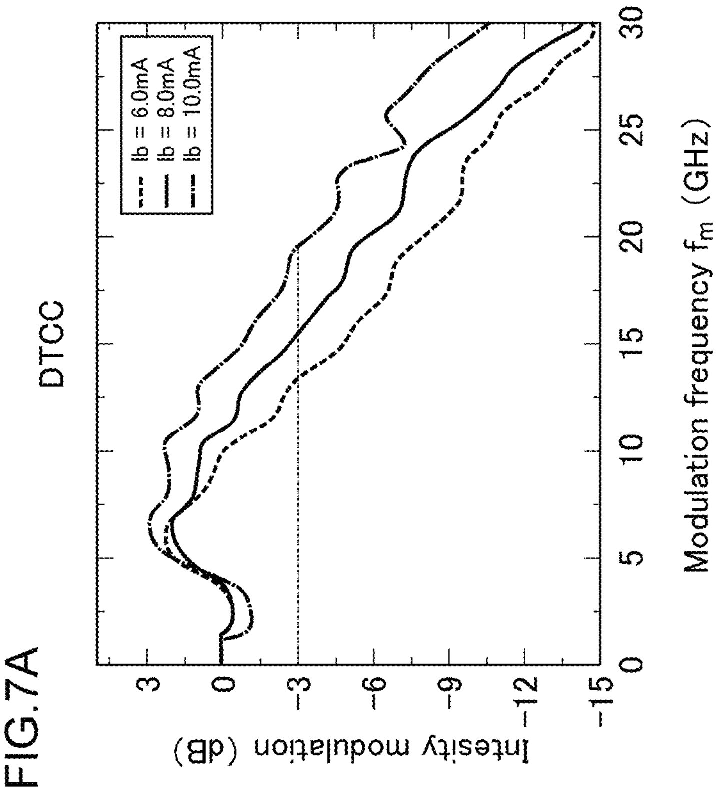

FIGS. 7A and 7B are diagrams showing the measurement results of the modulation bandwidth provided by the DTCC sample and the STCC sample. The design parameters of the DTCC and STCC are as follows.

*DTCC*

$$\lambda_1 = 850\ \text{nm}$$

$$W = 4\ \mu\text{m},\ L_{c1} = 10\ \mu\text{m},\ L_{c2} = 9\ \mu\text{m}$$

$$\eta_1 = 0.25,\ \eta_2 = 0.25$$

*STCC*

$$\lambda_1 = 850\ \text{nm}$$

$$W = 4\ \mu\text{m},\ L_{c1} = 4\ \mu\text{m}$$

$$\eta_1 = 0.25$$

The measurement results show the same tendency as that of the simulation results. It can be confirmed that, with such an arrangement in which multiple external resonators 30 are coupled, this allows the modulation bandwidth to be extended.

Figure 8A:
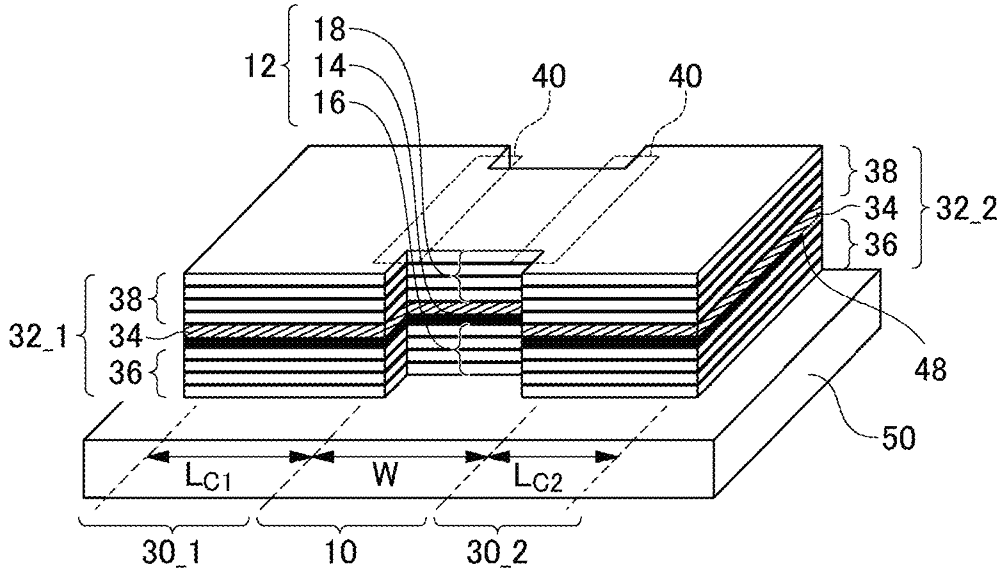
FIGS. 8A and 8B are a perspective view and a plane view showing the surface emitting laser according to an example.
Figure 8B:
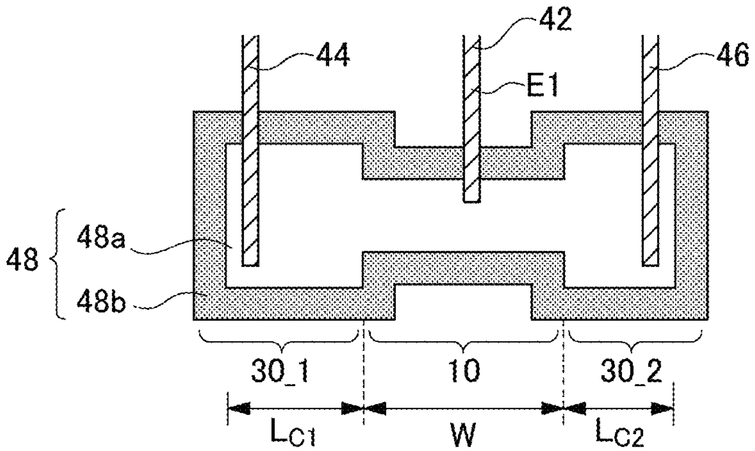

Next, description will be made regarding the cross-sectional structure of the surface emitting laser 1A. FIGS. 8A and 8B are a perspective view and a plane view of the surface emitting laser 1A according to an example.

In this example, the main resonator 10 and the external resonators 30_1 and 30_2 are configured in a rectangular shape, and are arranged such that they are coupled on one side. The coupling coefficients $\lambda_1$ and $\lambda_2$ can be tuned using the shape, width, length, equivalent refractive index, etc. of the active layer at a coupling portion 40 as their parameters. The equivalent refractive index may be controlled by adjusting an impurity doping amount or a material thereof. Also, the phase □ of the feedback light can be designed based on the respective lengths $L_{c1}$ and $L_{c2}$ of the external resonators 30_1 and 30_2.

As shown in FIG. 8A, the main resonator 10 and the external resonators 30_1 and 30_2 respectively have a VCSEL structure 12, 32_1, and 32_2, which is formed so as to have a continuous active layer. The VCSEL structure and the materials may be designed using known techniques. Such an arrangement is not restricted in particular. Description will be made regarding an example thereof. For example, the semiconductor substrate 50 may be configured as a III-V semiconductor substrate. Specifically, the semiconductor substrate 50 may be configured as a GaAs substrate. An electrode (not shown) may be formed on the back face of the semiconductor substrate 50. The bottom DBR 16(36) has a layered structure in which Si(n-type dopant)-doped $Al_{0.92}Ga_{0.08}As$ layers and $Al_{0.16}Ga_{0.84}As$ layers (AlGaAs is aluminum gallium arsenide) are alternately and repeatedly layered, which provides a reflectivity of nearly 100%.

The active layer 14(34) has a multiple quantum well structure comprising $In_{0.2}Ga_{0.8}As/GaAs$ (indium gallium arsenide/gallium arsenide) layers. The active layer 14(34) may have a triple quantum well structure, for example. Furthermore, a lower spacer layer and an upper spacer layer, each of which is configured as an undoped $Al_{0.3}Ga_{0.7}As$ layer, may be provided to both sides of the multiple quantum well structure, as necessary.

The top DBR 18 (38) can be formed as a semiconductor layer, dielectric multilayer film, or a combination thereof. For example, the top DBR 18 (38) has a layered structure in which carbon-doped $Al_{0.92}Ga_{0.08}As$ layers and $Al_{0.16}Ga_{0.84}As$ layers (AlGaAs is aluminum gallium arsenide) are alternately and repeatedly layered. In order to allow the laser beam to be output in the vertical direction, the top DBR 18 of the main resonator 10 is designed such that the number of layers is determined so as to provide a reflectivity of lower than 100%. In contrast, the external resonators 30_1 and 30_2 are designed such that the top DBR 38 provides a reflectivity of substantially 100% so as to prevent the laser beam from leaking in the vertical direction. It should be noted that the upper sides of the external resonators 30_1 and 30_2 may each be covered by a metal layer.

An electrode for RF signal 42 is formed on the top face of the main resonator 10. Furthermore, control electrodes 44 and 46 are formed on the top faces of the external resonators 30_1 and 30_2, respectively. A current confinement layer (oxidation layer) 48 is provided to the main resonator 10 and the external resonators 30_1 and 30_2. The current confinement layer 48 can be formed by selective oxidation, and includes an oxidation region 48*b* formed along the outer circumference and a non-oxidation region 48*a* (which will be referred to as a “conduction region” or “oxide aperture”) surrounded by the oxidation region 48*b*. By adjusting the shape of the current confinement layer 48, the effective sizes of the main resonator 10 and the external resonators 30_1 and 30_2 can also be controlled. This allows the coupling coefficients $\eta_1$ and $\eta_2$ to be controlled.

Figure 9B:
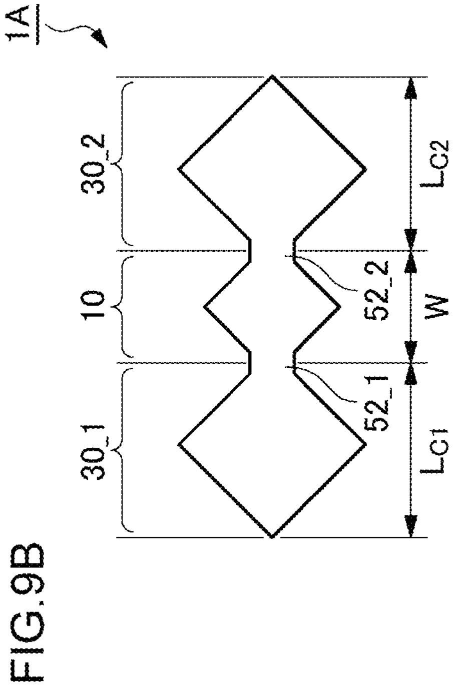
FIGS. 9A, 9B, and 9C are plane views each showing the surface emitting laser according to a modification.
Figure 9A:
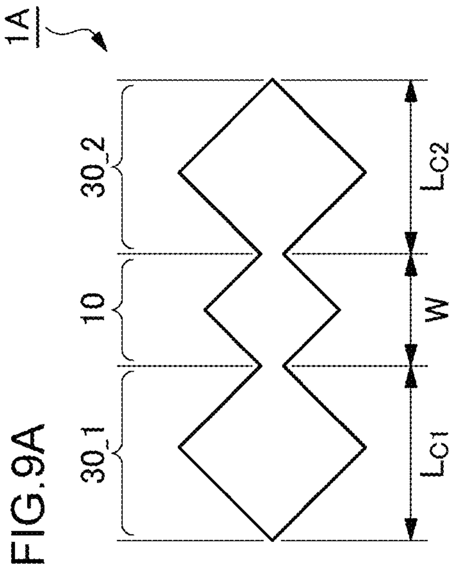
Figure 9C:
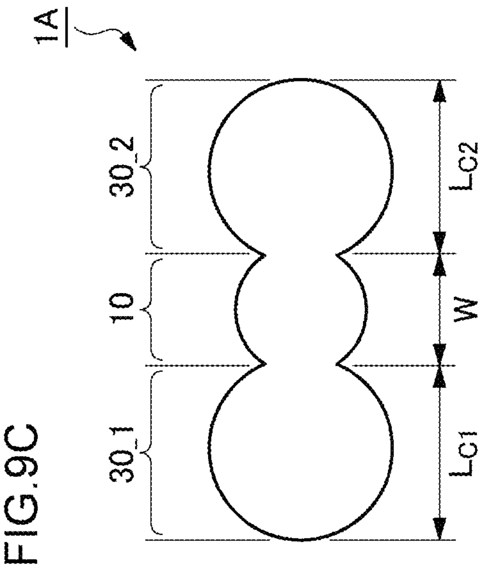

FIGS. 9A through 9C are plane views each showing the surface emitting laser 1A according to a modification. As shown in FIG. 9A, the main resonator 10 and the external resonators 30 are each configured in a rectangular shape (square), and are arranged such that the slow light propagates along their diagonal lines and such that they are coupled via their vertices. FIG. 9B shows an arrangement in which the main resonators 10 and the external resonators 30 each having a rectangular or rhombic shape are coupled via their vertices as with an arrangement shown in FIG. 9A. In addition, such an arrangement shown in FIG. 9B is provided with coupling portions 52 each of which is arranged between the main resonator 10 and the corresponding external resonator 30. The coupling portions 52 are each configured to have an equivalent VCSEL structure as the main resonator 10 and the external resonators 30.

FIG. 9C shows an arrangement in which the main resonator 10 and the external resonators 30 are formed in a circular or elliptical shape, and arranged such that they are coupled via portions thereof.

Figure 10B:
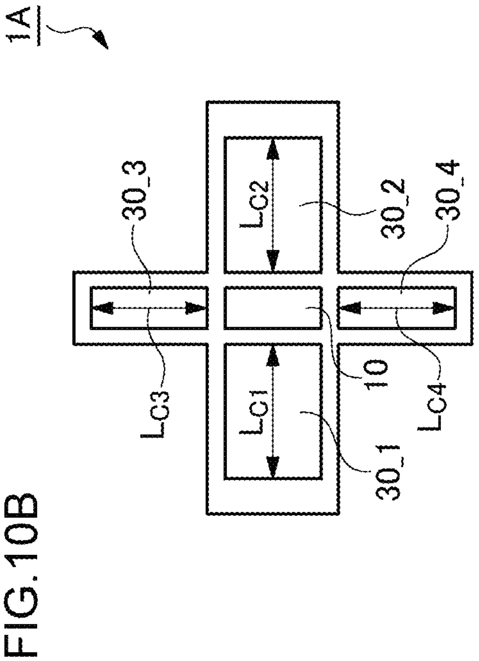
FIGS. 10A, 10B, 10C, and 10D are plane views each showing a surface emitting laser according to a modification.
Figure 10D:
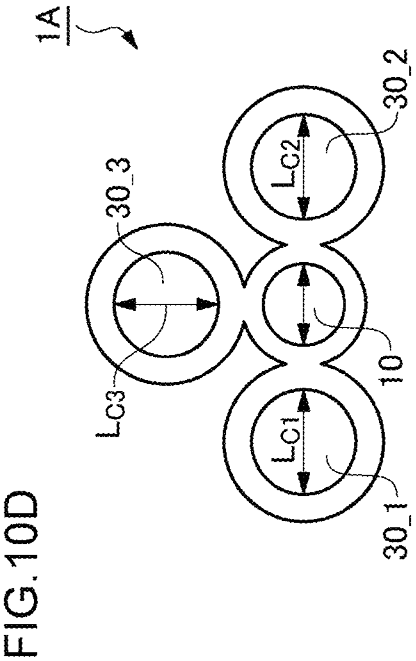
Figure 10A:
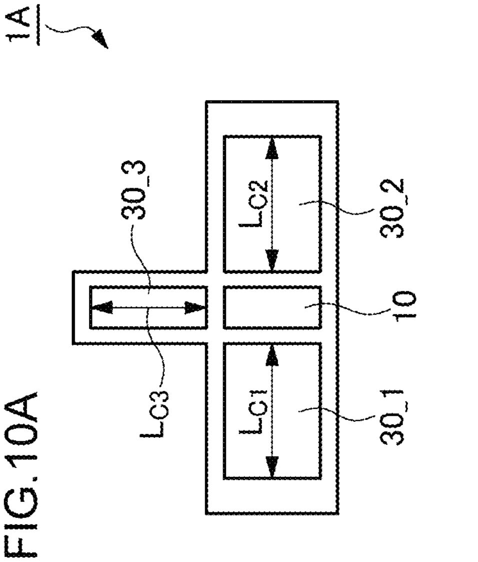
Figure 10C:
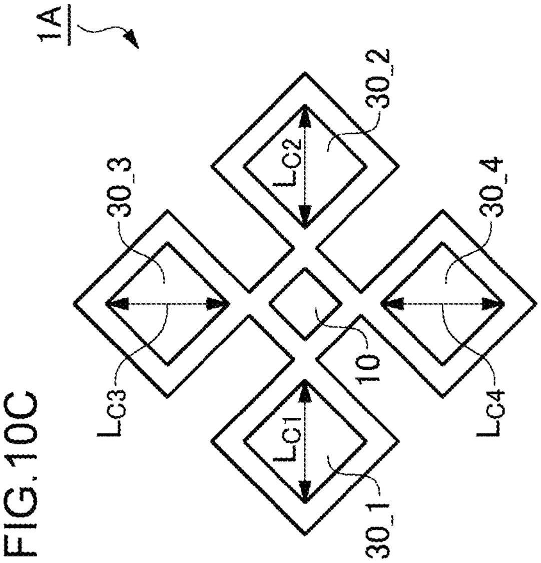

The number N of the external resonators 30 is not restricted to 2. Also, the number N of the external resonators 30 may be designed to be 3, 4, or more. FIGS. 10A through 10D are plane views each showing the surface emitting laser 1A according to a modification. FIG. 10A shows an arrangement in which three external resonators 30_1, 30_2, and 30_3 are coupled to three sides of the main resonator 10. FIG. 10B shows an arrangement in which four external resonators 30_1 through 30_4 are coupled to four sides of the main resonator 10. In FIGS. 10A and 10B, the external resonators 30 are each configured to have a rectangular shape, and to have sides in the slow light propagation direction and sides in a direction that is orthogonal to the slow light propagation direction. FIG. 10C shows an arrangement in which four external resonators 30_1 through 30_4 are coupled to four vertices of the main resonator 10. Each external resonator 30 is configured to have a rectangular shape with a diagonal extending in the slow light propagation direction. FIG. 10D shows an arrangement in which three circular-shaped external resonators 30_1 through 30_3 are coupled to a circular-shaped main resonator 10.

Embodiment 2

Figure 11:
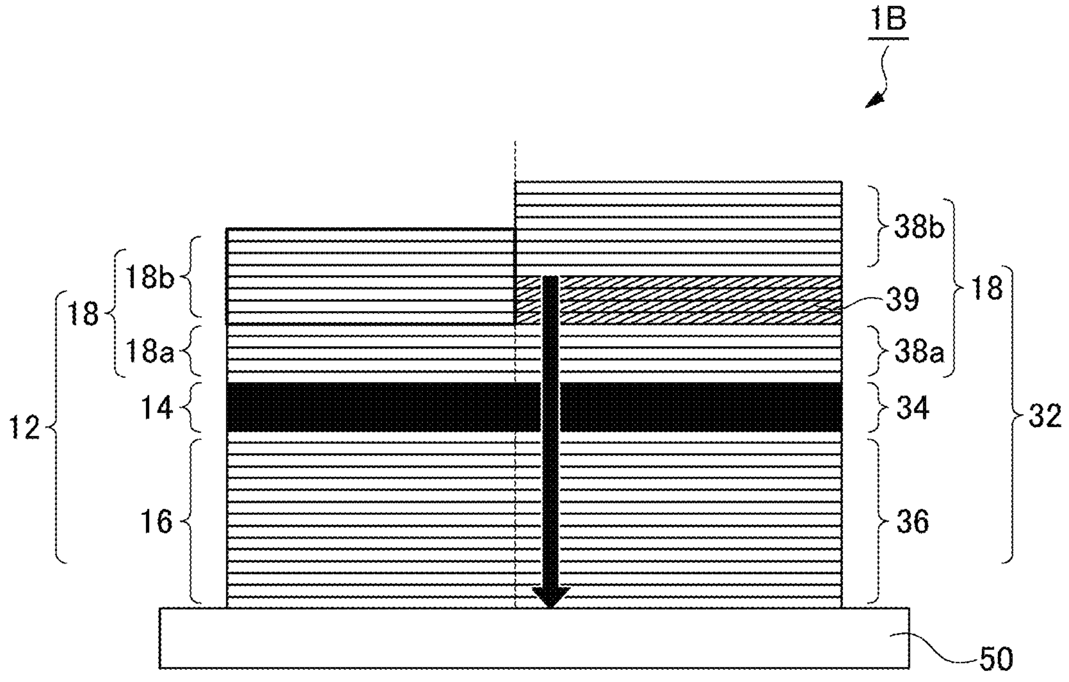
FIG. 11 is a cross-sectional diagram showing a surface emitting laser according to an embodiment 2.

FIG. 11 is a cross-sectional diagram showing a surface emitting laser 1B according to an embodiment 2. The surface emitting laser 1B includes a main resonator 10 and one or multiple external resonators 30. FIG. 11 shows an arrangement in which N=1.

The main resonator 10 has a VCSEL structure 12 including an active layer 14, a bottom DBR 16, and a top DBR 18. The top DBR 18 provided to an upper portion of the main resonator 10 is configured to have a reflection ratio that is lower than 100%. This allows the laser beam to be output through an output window 20 provided to an upper portion of the main resonator 10. Furthermore, an electrode for RF signal 22 is formed in the vicinity of the output window 20.

The external resonator 30 has a VCSEL structure 32 as with the main resonator 10. The VCSEL structure 32 includes an active layer 34, a bottom DBR 36, and a top DBR 38. The VCSEL structure 32 is configured such that its active layer 34 is continuous with the active layer 14 of the VCSEL structure 12 of the main resonator 10.

Each external resonator 30 is not required to allow the laser beam to be output. Accordingly, each external resonator 30 is provided with no output window. Also, the top DBR 38 may be configured to have a reflectivity of 100%. Also, a shielding portion such as a metal film or the like may be formed on the upper face of the top DBR 38.

The main resonator 10 and each external resonator 30 are optically coupled with a common active layer in the transverse direction.

In the embodiment 2, the main resonator 10 and the external resonator 30 are configured to provide different resonance wavelengths. Specifically, the main resonator 10 and the external resonator 30 are configured such that they have different effective optical path lengths (resonator lengths) in the vertical direction (depth direction). The effective optical path length can be controlled by adjusting the physical depth (length) and the refractive index.

FIG. 11 shows an arrangement in which $\lambda_1<\lambda_2$. Accordingly, the resonator length of the external resonator 30 is designed to be longer than that of the main resonator 10. In order to provide such a structure, a phase adjustment layer 39 is provided. The phase adjustment layer 39 may be configured as a semiconductor layer or a dielectric layer.

Description will be made regarding an example of a method for forming the phase adjustment layer 39. The VCSEL structure 12 (32) is configured as a half-VCSEL structure. The top DBR 18 (38) includes a semiconductor layer **18*a* (38*a*) and a dielectric multilayer film layer 18*b* (38*b*). In an example, first, the phase adjustment layer 39 is formed over the entire upper face of the semiconductor layer 18*a* (38*a*). In the subsequent wet etching process, a portion of the phase adjustment layer 39 that partly overlaps with the semiconductor layer 18*a* is removed. Subsequently, the dielectric multilayer films 18*b* and 38*b*** are formed.

In a case in which the phase adjustment layer 39 is formed of a semiconductor material, examples of such a semiconductor material that can be employed include GaAs, Si, GaAlAs, InP, GaInAsP, GaAlInP, GaN, GaAlN, etc.

In a case in which the phase adjustment layer 39 is formed of a dielectric material, examples of such a dielectric material that can be employed includes $SiO_2$, $TiO_2$, $Ta_2O_5$, etc.

Also, the phase adjustment layer 39 may be configured as a multilayer structure formed of different semiconductor materials, or as a multilayer structure formed of different dielectric materials. Also, the phase adjustment layer 39 may be configured as a multilayer structure formed of semiconductor materials and dielectric materials.

Figure 12:
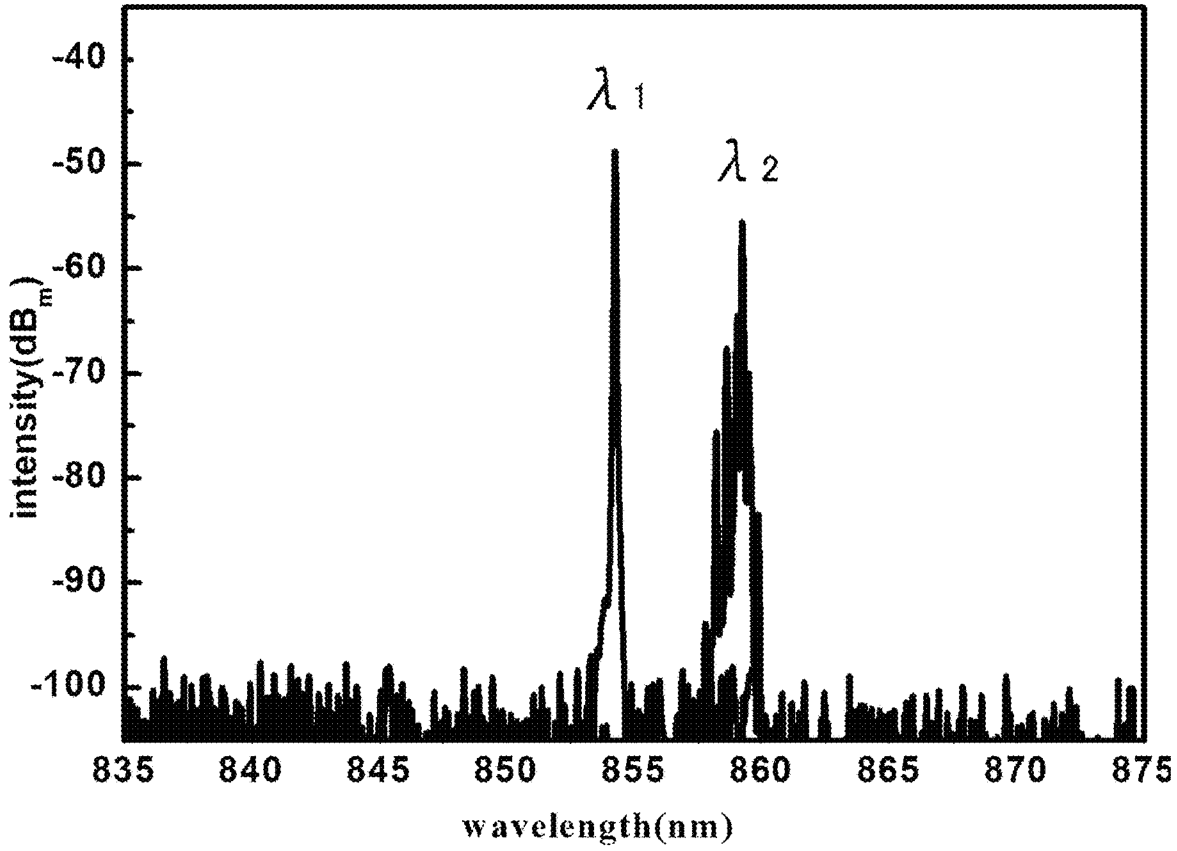
FIG. 12 is a diagram showing the lasing spectra (measurement results) of a main resonator and an external resonator.

Next, description will be made regarding the advantage of the surface-emitting layer 1B. FIG. 12 is a diagram showing oscillation spectrums (measurement results) of the main resonator 10 and the external resonator 30 of the surface emitting laser 1B shown in FIG. 11. With such an arrangement including the phase adjustment layer 39 as an additional layer, this allows the difference between the resonance wavelengths $\lambda_1$ and $\lambda_2$ to be greatly increased. In this example, this provides a wavelength difference of as much as $\Delta\lambda=\lambda_2-\lambda_1=5$ nm.

Figure 13:
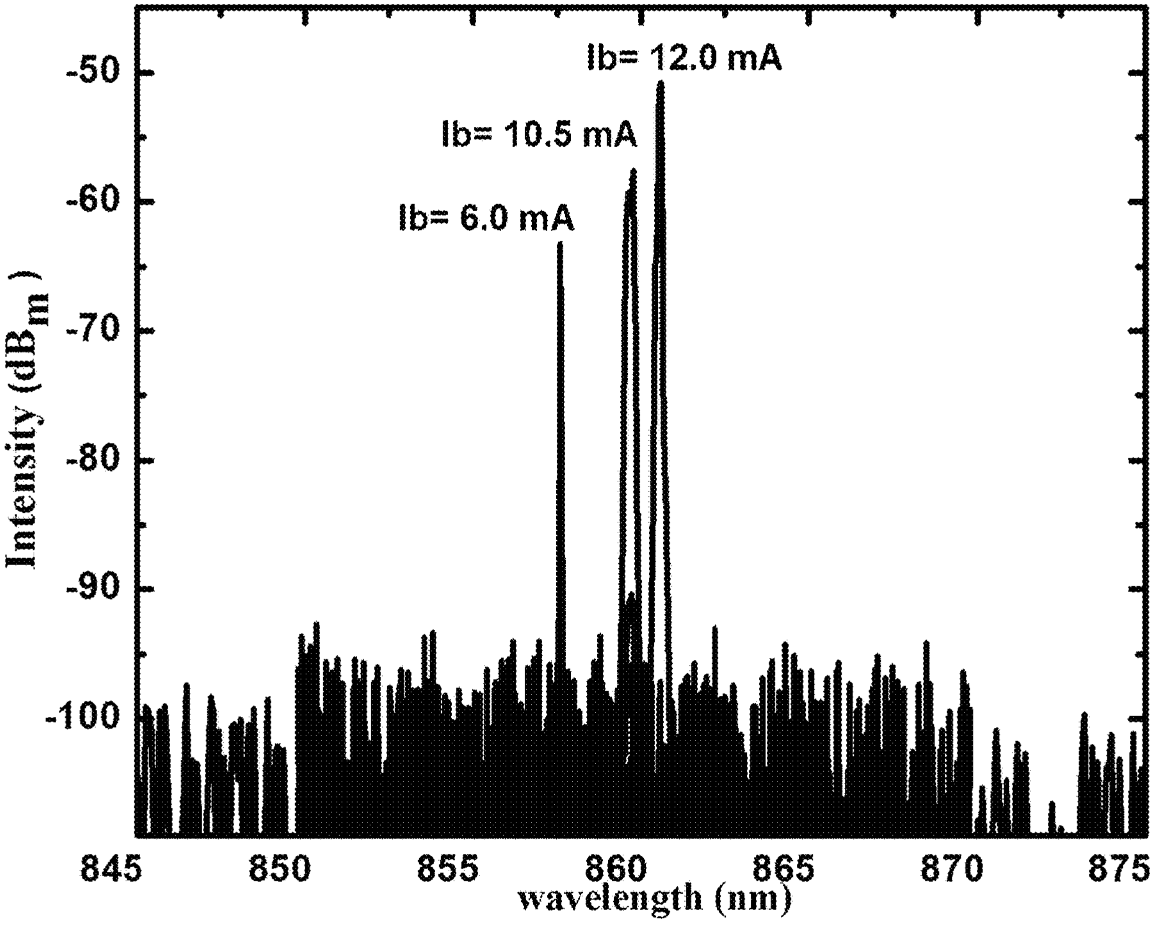
FIG. 13 is a diagram showing a spectrum of the output beam of the surface emitting laser.

FIG. 13 is a diagram showing the spectrum of the output beam of the surface emitting laser 1B. In an arrangement as disclosed in Patent document 1 in which a main resonator and a single external resonator each configured to provide a similar resonance wavelength are coupled with each other, an increase of bias current leads to the occurrence of an unstable state in single mode oscillation. Specifically, oscillation occurs at multiple wavelengths. In contrast, with the surface emitting laser 1B shown in FIG. 11, such an arrangement is capable of suppressing multi-mode oscillations even if the bias current Ib is increased, thereby maintaining single-mode oscillation.

Figure 14:
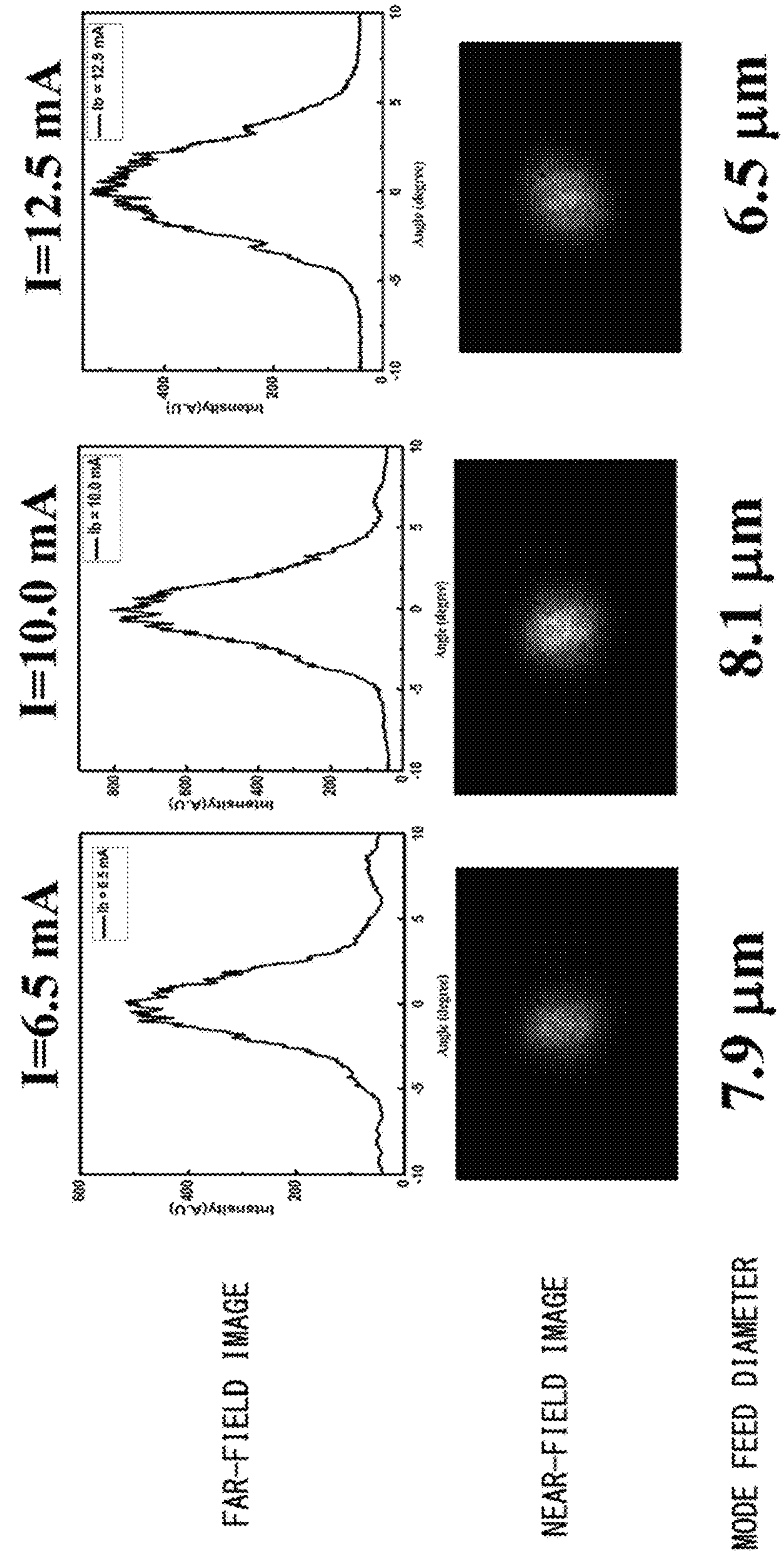
FIG. 14 is a diagram showing a far-field pattern and a near-field pattern of the output of the surface emitting laser.

FIG. 14 is a diagram showing measurement results of a far-field pattern and a near-field pattern of an output of the surface emitting laser 1B provided with a main resonator and two external resonators. The beam profile was measured for bias currents Ib=6.5 mA, 10 mA, and 12.5 mA. The oxide aperture is designed to be 7 μm×8 μm. With an ordinary oxide confinement structure, in a case in which the oxide aperture size is larger than 3 μm, it is difficult to provide a single-profile near-field pattern. In contrast, with the surface emitting laser 1B according to the embodiment 2, such an arrangement is capable of supporting single mode operation even if the oxide aperture size is 7 μm×8 μm.

The technique of the embodiment 2 may be combined with the technique described in the embodiment 1. For example, in the surface emitting laser 1A shown in FIG. 8, at least one of the external resonators 30_1 and 30_2 may be configured such that its resonance wavelength is designed to be longer or shorter than the resonance wavelength of the main resonator 10. Specifically, the phase adjustment layer 39 may be inserted into at least one from among the VCSEL structures 32_1 and 32_2 of the external resonators 30_1 and 30_2.

Embodiment 3

Figure 15A:
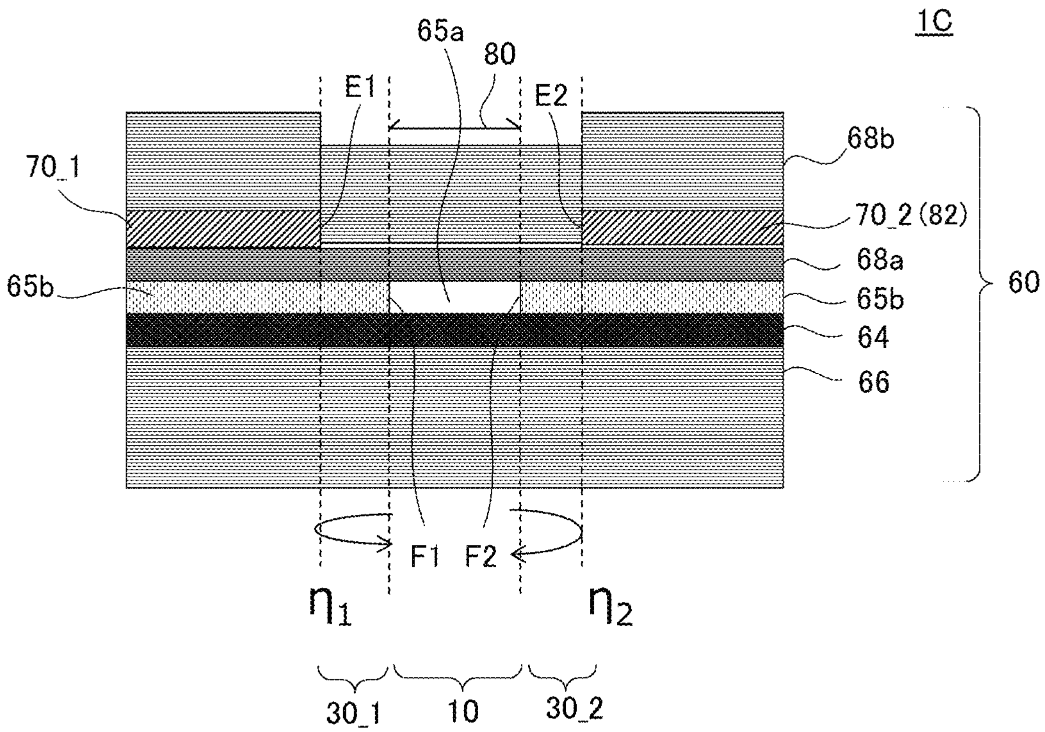
FIGS. 15A and 15B are a cross-sectional view and a plane view showing a schematic structure of a surface emitting laser according to an embodiment 3.
Figure 15B:
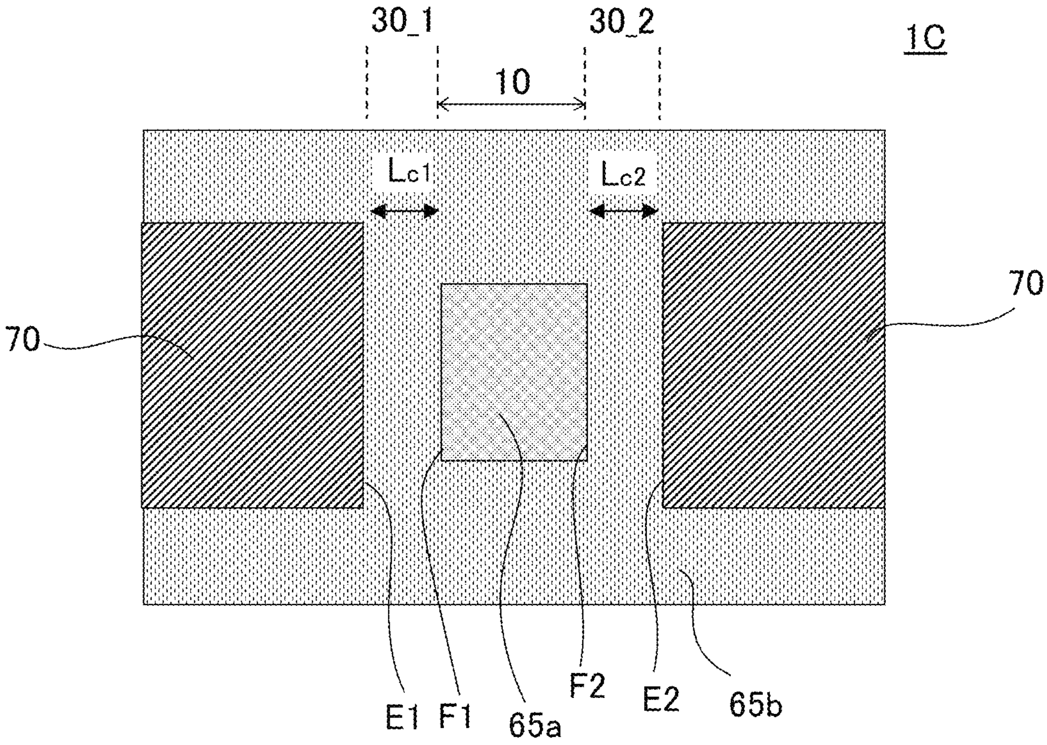

FIGS. 15A and 15B are a cross-sectional view and a plan view of a surface emitting laser 1C according to an embodiment 3. The surface emitting laser 1C includes a main resonator 10 and one external resonator 30 or multiple external resonators 30. FIGS. 15A and 15B shows an arrangement in which N=2.

The main resonator 10 and the external resonators 30 each have a VCSEL structure 60 such that the corresponding layers are continuously formed. The VCSEL structure 60 includes a bottom DBR 66, an active layer 64, an oxidation layer 65, and a top DBR 68. The DBR 68 includes a semiconductor DBR **68*a* and a dielectric DBR 68*b***.

The oxidation layer 65 provides a current confinement structure. As shown in FIG. 15B, the oxidation layer 65 includes an outer-side oxidation region **65*b* and a non-oxidation region 65*a* surrounded by the oxidation region 65*b*. The non-oxidation region 65*a* is an oxide aperture and corresponds to the main resonator 10**.

Furthermore, electrodes 70_1 and 70_2 are each formed in a region adjacent to the main resonator 10 in the surface emitting laser 1C in the transverse direction in the drawing such that it is arranged between the semiconductor DBR **68*a* and the dielectric DBR 68*b*. A region interposed between the two electrodes 70_1 and 70_2 will be referred to as a "metal aperture". A region that corresponds to the non-oxidation region 65*a* will be referred to as an "oxide aperture". The apertures described above may be distinguished as necessary. The electrodes 70_1 and 70_2 are each configured as a p-type electrode for injecting a driving current. The slow light propagating in the transverse direction in the drawing is reflected by the sides (electrode boundaries) E1 and E2 of the two electrodes 70_1 and 70_2. Each external resonator 30** is configured to operate using the reflection that occurs at the boundary of the electrode.

With this configuration, a region interposed between the oxidation boundaries F1 and F2 of the non-oxidation region **65*a* functions as the main resonator 10. A region interposed between the oxidation boundary F1 of the non-oxidation region 65*a* and the side E1 of the electrode 70_1 functions as the external resonator 30_1. A region interposed between the oxidation-layer boundary F2 of the non-oxidation region 65*a* and the side E2 of the electrode 70_2 functions as the external resonator 30_2**.

In the embodiment 3, the main resonator 10 and the external resonators 30 may be configured to provide the same resonance wavelength. Specifically, the main resonator 10 and the external resonators 30 may each have the same layer structure in the vertical direction (depth direction) except for the electrodes and the oxidation layers.

With the surface emitting laser 1C shown in FIGS. 15A and 15B, the slow light wave is reflected by the sides E1 and E2 of the electrodes 70_1 and 70_2 due to the discontinuities in their optical characteristics. The electrodes 70_1 and 70_2 can each be regarded as an optically discontinuous portion.

The surface emitting laser 1C has a VCSEL structure 60 including the top DBR 68 and the aperture 80 provided by the current confinement structure (e.g., selective oxidation layer 65). An optically discontinuous portion 82 is formed in the top DBR 68, at a region with a gap between the region and the aperture 80 in a transverse direction. In an example, the optically discontinuous portion 82 is configured of a metal material. More specifically, the optically discontinuous portion 82 may be configured as a p electrode for injecting a current to the VCSEL structure 60. In another example, the optically discontinuous portion 82 may be configured as a metal film formed separately from the p-type electrode. It should be noted that the current confinement structure is not restricted to such an arrangement formed by the selective oxidation technique. Also, the current confinement structure may be formed using the regrowth technique, or may be formed by proton implantation.

Figure 16:
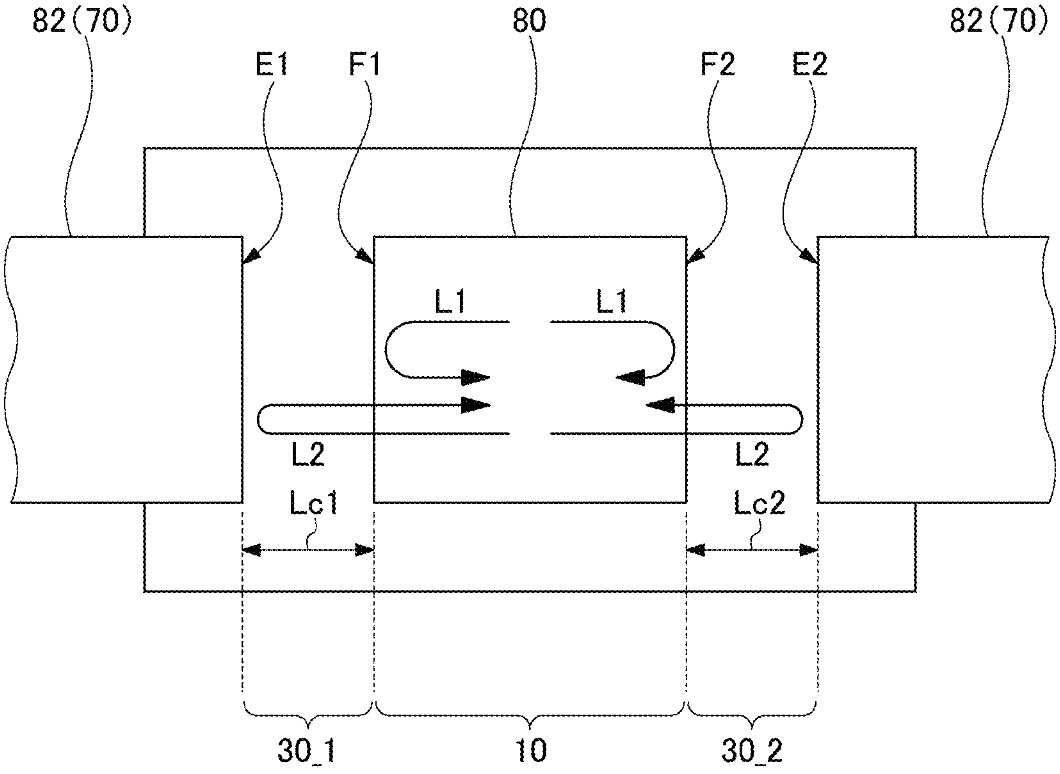
FIG. 16 is a diagram for explaining light guiding of the surface emitting laser according to the embodiment 3.

FIG. 16 is a diagram for explaining the light wave guiding of the surface emitting laser 1C according to the example 3. FIG. 16 is a diagram showing the surface emitting laser 1C as viewed from above. The light L1 that propagates through the main resonator 10 in the transverse direction is reflected by the end portion of the aperture 80. The light L2 that leaks from the aperture 80 to the exterior (external resonator 30) is reflected by the end portion of the optically discontinuous portion 82, and is fed back to the internal portion (main resonator 10) defined in the aperture 80. Also, the aperture may be configured in a circular shape. The external portion (external resonator 30) may be formed such that it surrounds the aperture 80.

In order to allow the light propagating from the main resonator 10 in the transverse direction to be reflected, the distance $L_{c1}$ ($L_{c2}$) between the boundary E1 (E2) of the electrode 70_1 (70_2) and the oxidation boundary F1 (F2) of the main resonator 10 may preferably be designed to be on the order of 3 μm or to be smaller than 3 μm. Directing attention to the light propagation in the transverse direction, light cannot propagate due to the effect of the oxidized current confinement layer. Accordingly, the light reflection as used here can be regarded as leakage of light in the form of evanescent waves. For example, the distance $L_{c1}$ ($L_{c2}$) may be designed to be equal to or smaller than 2 μm. This allows the light to be effectively fed back from the external resonator 30 to the main resonator 10.

Figure 17A:
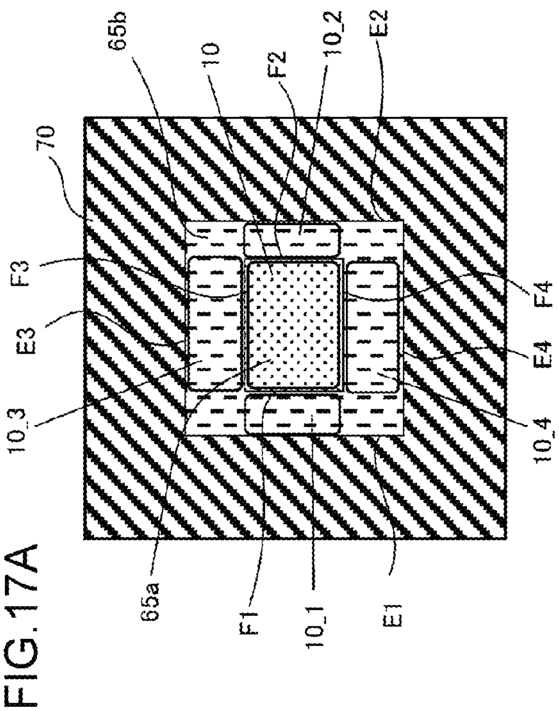
FIGS. 17A, 17B, and 17C are plane views each showing a surface emitting laser according to a modification of the embodiment 3.
Figure 17B:
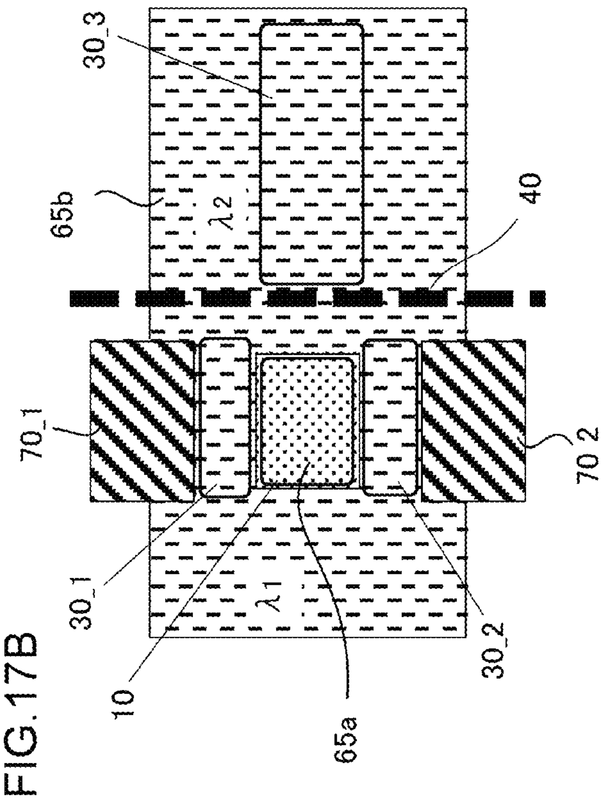
Figure 17C:
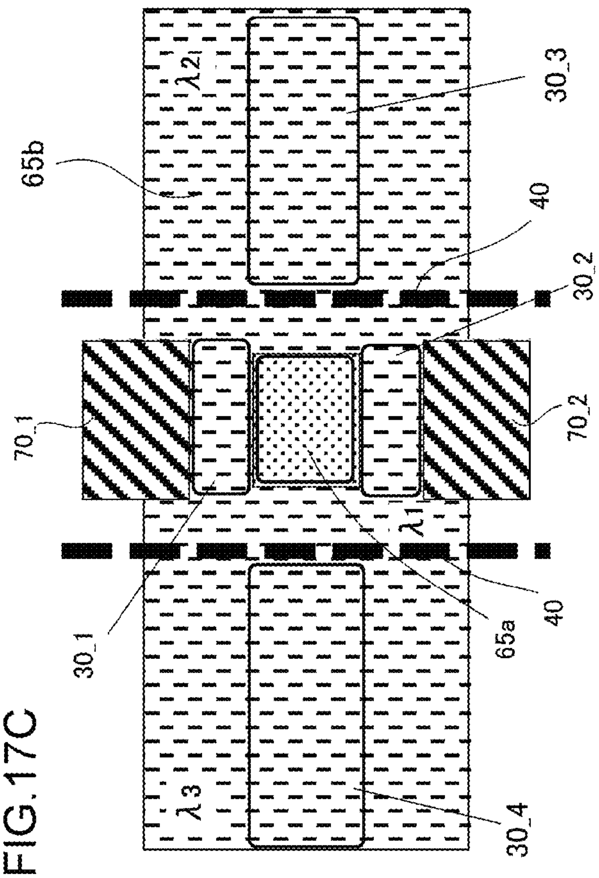

FIGS. 17A through 17C are plan views each showing the surface emitting laser 1*c* according to a modification of the embodiment 3. FIG. 17A shows an arrangement in which the electrode 70 is formed such that it surrounds the non-oxidation region 65*a*. A region surrounded by oxidation boundaries F1 through F4 functions as the main resonator 10. Furthermore, a region between the oxidation boundary F1 and the electrode boundary E1, a region between the oxidation boundary F2 and the electrode boundary E2, a region between the oxidation boundary F3 and the electrode boundary E3, and a region between the oxidation boundary F4 and the electrode boundary E4 respectively function as four external resonators 30.

A surface emitting laser 1C shown in FIG. 17B is configured as a combination of the embodiment 3 and the embodiment 2. As described in the embodiment 3, as the external resonators arranged in the vertical direction, the electrodes 70_1 and 70_2 are formed in portions adjacent to the upper portion and the lower portion of the main resonator 10. Furthermore, two external resonators 30_1 and 30_2 are provided such that they operate using the reflection from the boundaries of the electrodes 70_1 and 70_2. Furthermore, as the external resonators arranged in the transverse direction, an external resonator 30_3 according to the embodiment 2 that supports a different resonance wavelength ($\lambda_1 \neq \lambda_2$) in the vertical direction is coupled.

The surface emitting laser 1C shown in FIG. 17C is also configured as a combination of the embodiment 3 and the embodiment 2. Specifically, the electrodes 70_1 and 70_2 are formed in portions adjacent to the upper portion and the lower portion of the main resonator 10. Furthermore, two external resonators 30_1 and 30_2 are provided configured to operate using the reflection from the boundaries of the electrodes 70_1 and 70_2. Moreover, as the external resonator arranged in the transverse direction, an external resonator 30_3 according to the embodiment 2 that supports a different resonance wavelength ($\lambda_1 \neq \lambda_2$) in the vertical direction is coupled to a region adjacent to the right side of the main resonator 10. In addition, an external resonator 30_4 that provides a different resonance wavelength ($\lambda_1 \neq \lambda 3$) in the vertical direction is coupled to a region adjacent to the left side of the main resonator 10.

Figure 18A:
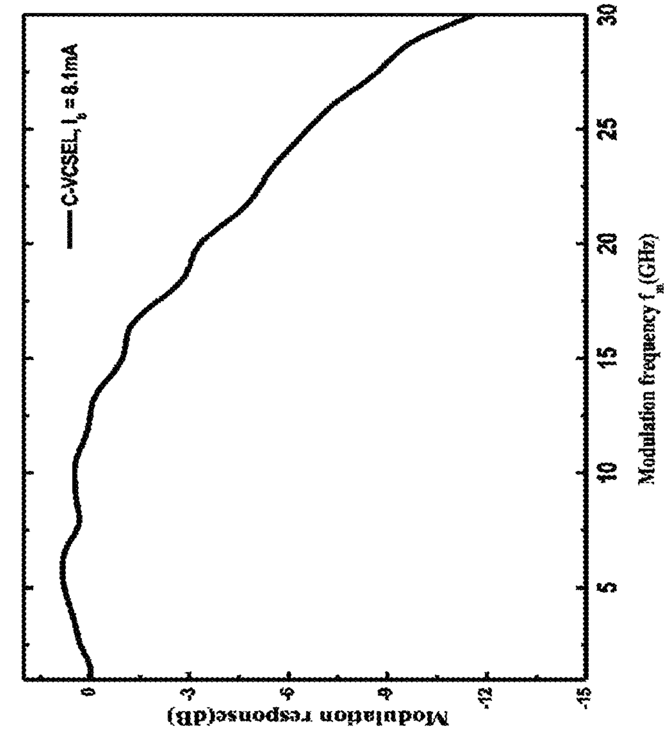
FIG. 18A is a diagram showing the measurement results of the modulation bandwidth of the surface emitting laser having the structure shown in FIG. 17A.

FIG. 18A is a diagram showing the measurement results of the modulation bandwidth provided by a device having a structure shown in FIG. 17A. The fabricated device has an oxide aperture (non-oxidation region) with a size of 8 μm×8 μm. Furthermore, an electrode having an opening with a size of 12 μm×12 μm is formed as an outer circumference of the oxide aperture. Such an arrangement provides a modulation bandwidth of 20 GHz that is approximately twice as large as that of ordinary surface emitting lasers having a large electrode opening.

Figure 18B:
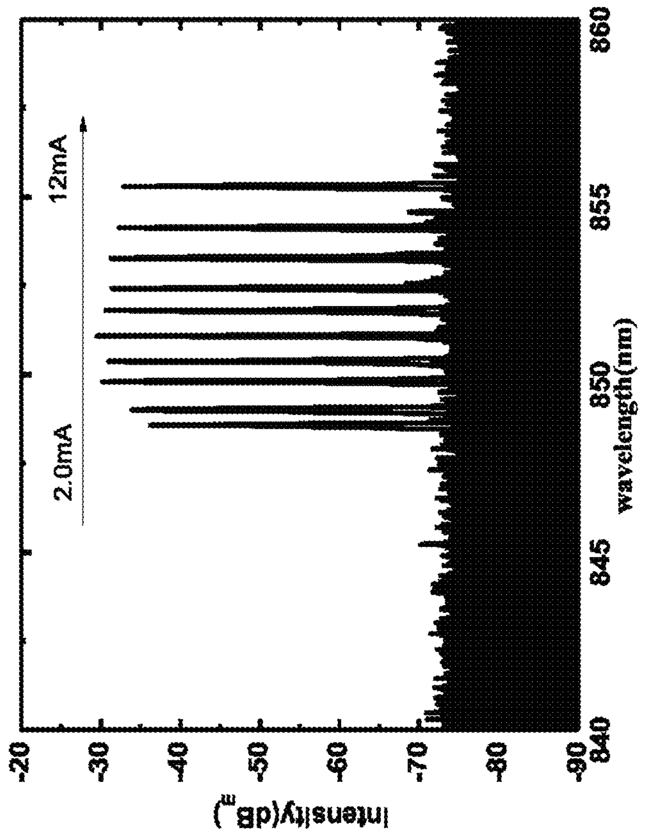
FIG. 18B is a diagram showing the measurement results of the lasing spectrum of the surface emitting laser having the structure shown in FIG. 17A.

FIG. 18B is a diagram showing the measurement results of the oscillation spectrum provided by a device having the structure shown in FIG. 17A. With ordinary surface emitting lasers having a large electrode opening, multi-mode oscillation is measured. In contrast, with the device shown in FIG. 18B, this provides single-mode operation over the entire current range.

Description will be made below regarding several examples of the surface emitting laser 1C according to the embodiment 3.

Figure 19:
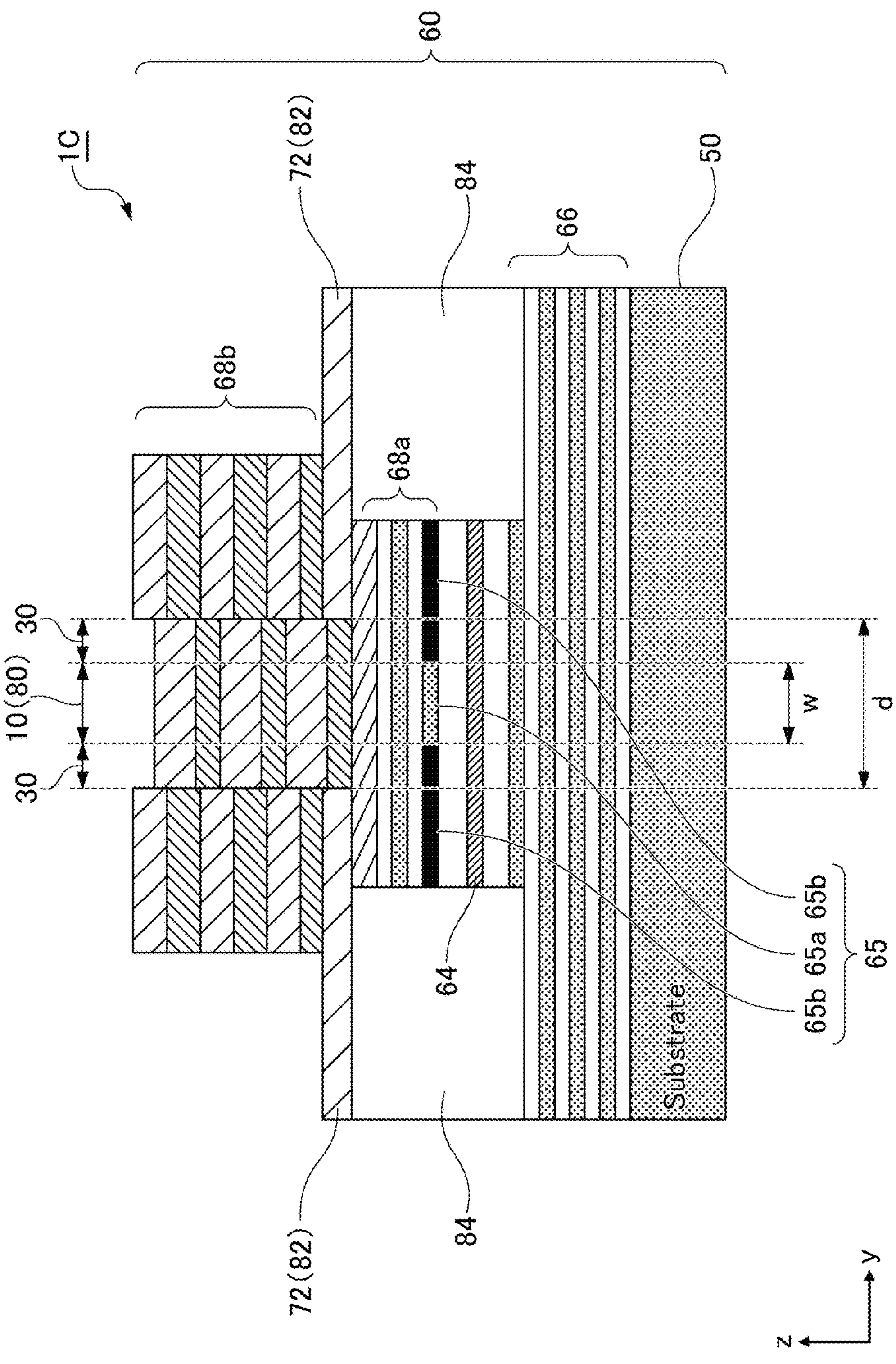
FIG. 19 is a cross-sectional diagram showing a surface emitting laser according to an example 1 of the embodiment 3.

FIG. 19 is a cross-sectional diagram showing the surface emitting laser 1C according to an example (example 1) of the embodiment 3. Here, "W" represents the width of the oxide aperture, and "d" represents the width of the metal aperture. In the example 1, as with the arrangement shown in FIG. 15A, the optically discontinuous portion 82 is formed of a metal material. More specifically, the p-type electrode 72 configured to allow current to be injected also has a function as the optically discontinuous portion 82. The p-type electrode 72 is arranged such that it is inserted between the semiconductor DBR 68*a* and the top DBR 68*b*. The VCSEL structure 60 has a mesa structure having an end portion filled with a resin 84 such as polyimide or the like. In order to allow the p-type electrode 72 to function as the optically discontinuous portion 82, the p-type electrode 72 is arranged in the vicinity of the oxide aperture 80 such that the distance between them is equal to or smaller than 3 μm, and more preferably, is equal to or smaller than 2 μm.

Figure 20:
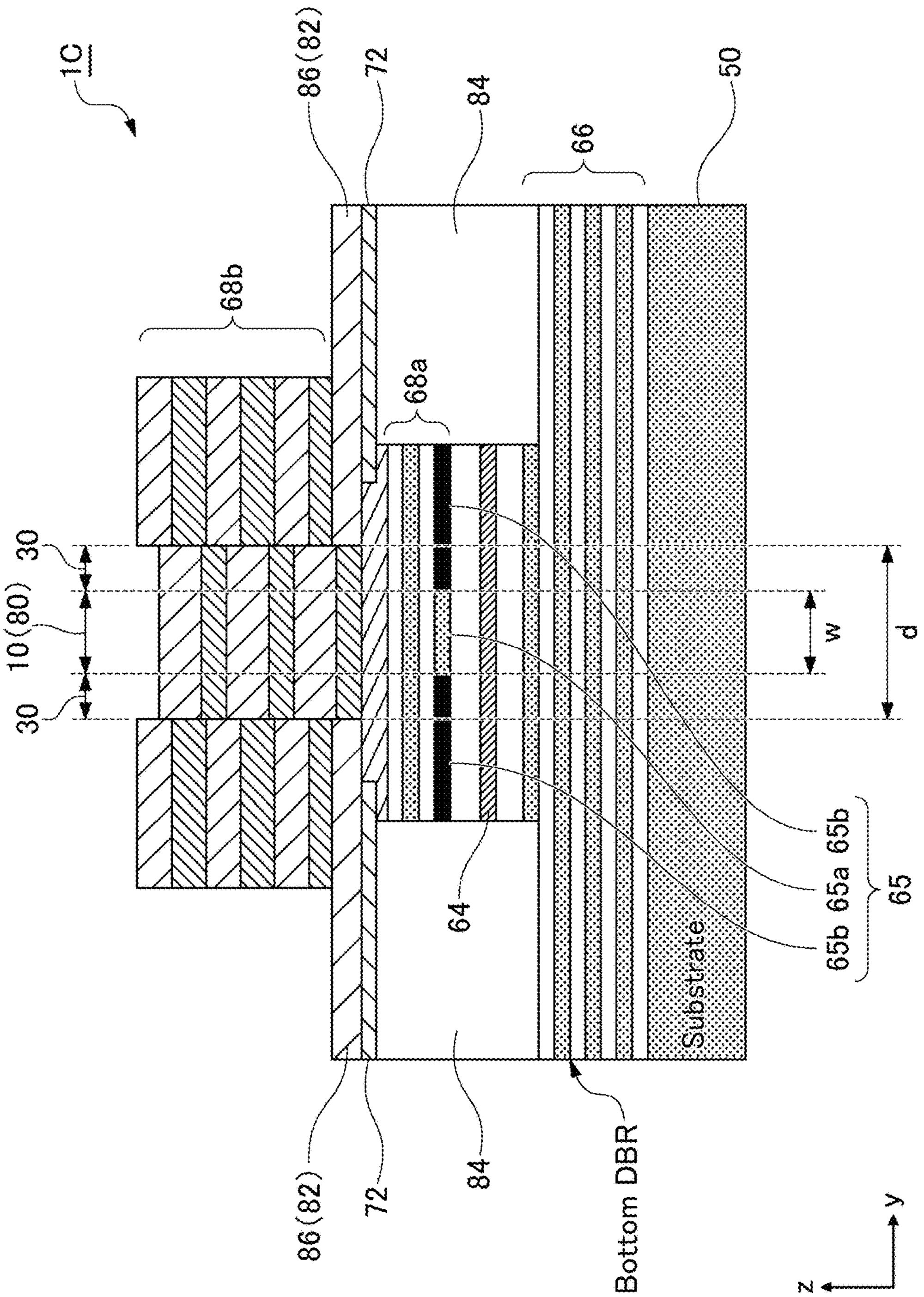
FIG. 20 is a cross-sectional diagram showing a surface emitting laser according to an example 2 of the embodiment 3.

FIG. 20 is a cross-sectional diagram showing the surface emitting laser 1C according to an example (example 2) of the embodiment 3. In this example 2, the distance between the p electrode 72 and the oxide aperture is 3 μm or more. Accordingly, the p-type electrode 72 does not function as the optically discontinuous portion 82. Instead, the optically discontinuous portion 82 is formed as a dielectric member 86. The dielectric member 86 may also be formed on the upper side of the p-type electrode 72. In the drawing, "d" represents the width of an aperture (dielectric aperture) defined by the dielectric material 86. The dielectric material 86 is not restricted in particular. Giving consideration to affinity with the semiconductor manufacturing process for the surface emitting laser 1C, $Si_xN_y$ or $Ta_2O_5$ may preferably be employed.

With the example 2, reflection of light occurs at the end portion of the dielectric member 86, and the light thus reflected is fed back to the main resonator 10. The dielectric member 86 transmits light. Accordingly, this arrangement allows a larger amount of light to be output as compared with an arrangement in which the optically discontinuous portion 82 is formed of a metal material.

Figure 21:
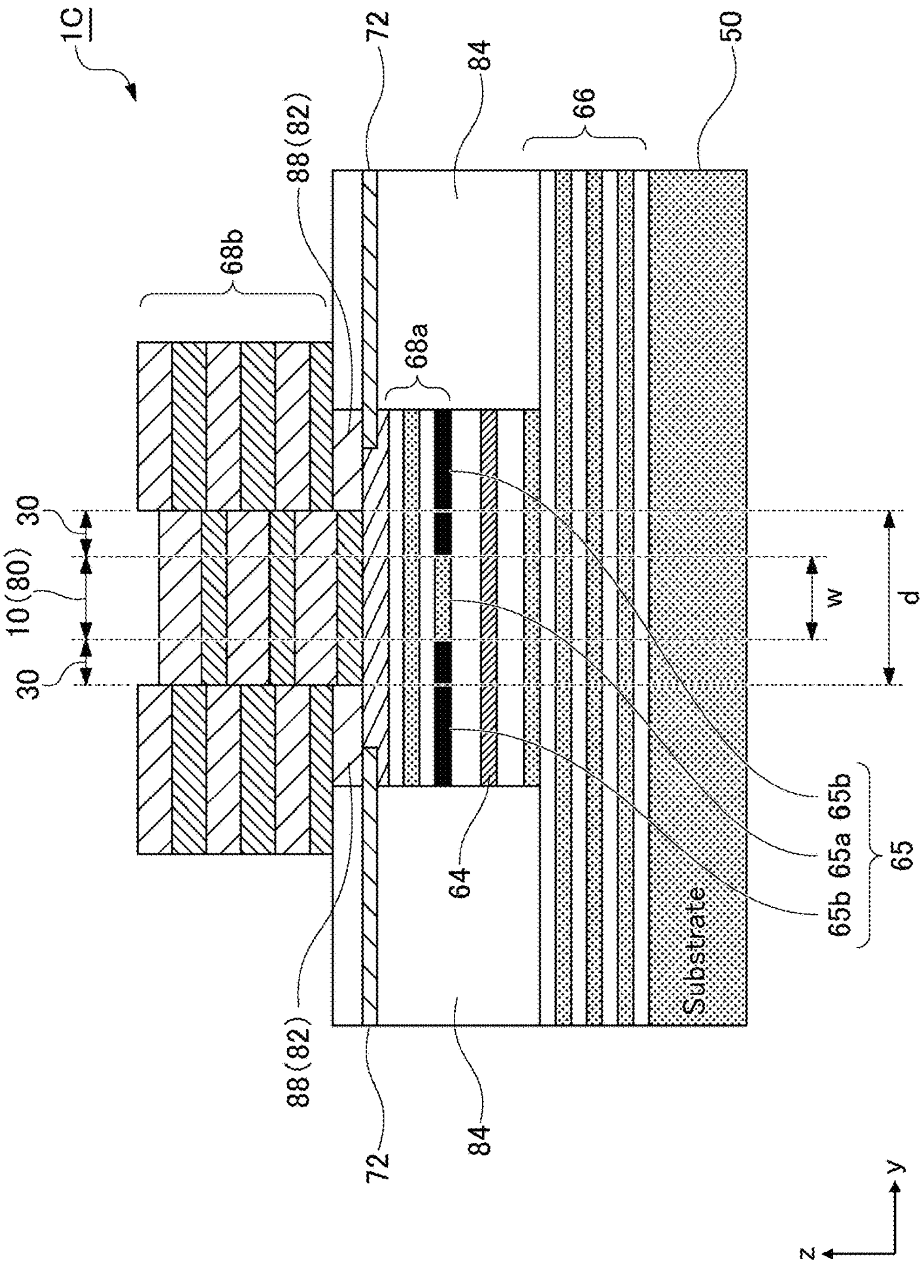
FIG. 21 is a cross-sectional diagram showing a surface emitting laser according to an example 3 of the embodiment 3.

FIG. 21 is a cross-sectional diagram showing the surface emitting laser 1C according to an example (example 3) of the embodiment 3. In this example 3, the distance between the p-type electrode 72 and the oxide aperture is 3 μm or more. Accordingly, the p-type electrode 72 does not function as the optically discontinuous portion 82. Instead, the optically discontinuous portion 82 is formed as a semiconductor material 88. The semiconductor material 88 is formed on the upper side of the p-type electrode 72. In the drawing, "d" represents the width of an aperture (semiconductor aperture) defined by the semiconductor material 88. The material of the semiconductor member 88 is not restricted in particular. Giving consideration to affinity with the semiconductor manufacturing process for the surface emitting laser 1C, Si is preferably be employed.

With the example 3, reflection of light occurs at the end portion of the semiconductor material 88, and the light thus reflected is fed back to the main resonator 10. The semiconductor material 88 is transparent. Accordingly, this arrangement allows a larger amount of light to be output as compared with an arrangement in which the optically discontinuous portion 82 is formed of a metal material.

Figure 22:
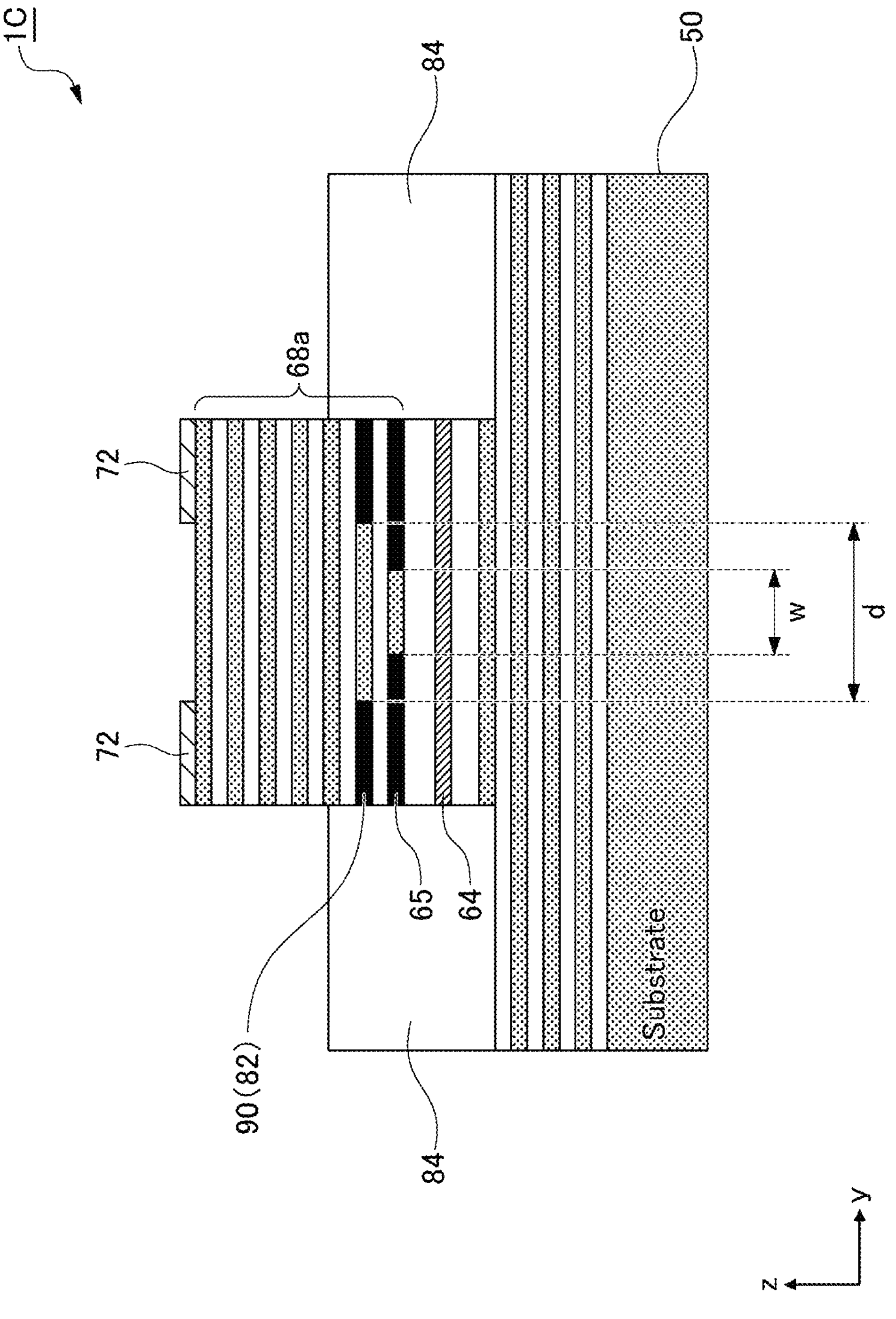
FIG. 22 is a cross-sectional diagram showing a surface emitting laser according to an example 4 of the embodiment 3.

FIG. 22 is a cross-sectional diagram showing the surface emitting laser 1C according to an example (example 4) of the embodiment 3. In this example 4, the distance between the p electrode 72 and the oxide aperture is 3 μm or more. Accordingly, the p-type electrode 72 does not function as the optically discontinuous portion 82. Instead, the optically discontinuous portion 82 is formed as an oxide film 90. The oxide film 90 may be formed in the form of an internal layer of the semiconductor DBR 68*a*. In the drawing, "d" represents the width of an aperture (second oxide aperture) defined by the oxide film 90.

The material of the oxide film 90 is not restricted in particular. Giving consideration to affinity with the semiconductor manufacturing process for the surface emitting laser 1C, the oxide film 90 may preferably be formed by selective oxidation. Specifically, a first oxidation layer 65 and a second oxidation layer 67, which can be subjected to selective oxidation, are formed on the semiconductor DBR 68*a*. Subsequently, deep oxidation is applied to the first oxidation layer 65 from the mesa-side face so as to form an oxidation region 65*b*, thereby forming a non-oxidation region 65*a* having a narrow width W. Furthermore, shallow oxidation is applied to the second oxidation layer 67 from the mesa-side face so as to form the oxide film 90.

With the example 4, reflection of light occurs at the end portion of the oxide film 90, and the light thus reflected is fed back to the main resonator 10. The oxide film 90 transmits light. Accordingly, this arrangement allows a larger amount of light to be output as compared with an arrangement in which the optically discontinuous portion 82 is formed of a metal material.

Figure 23:
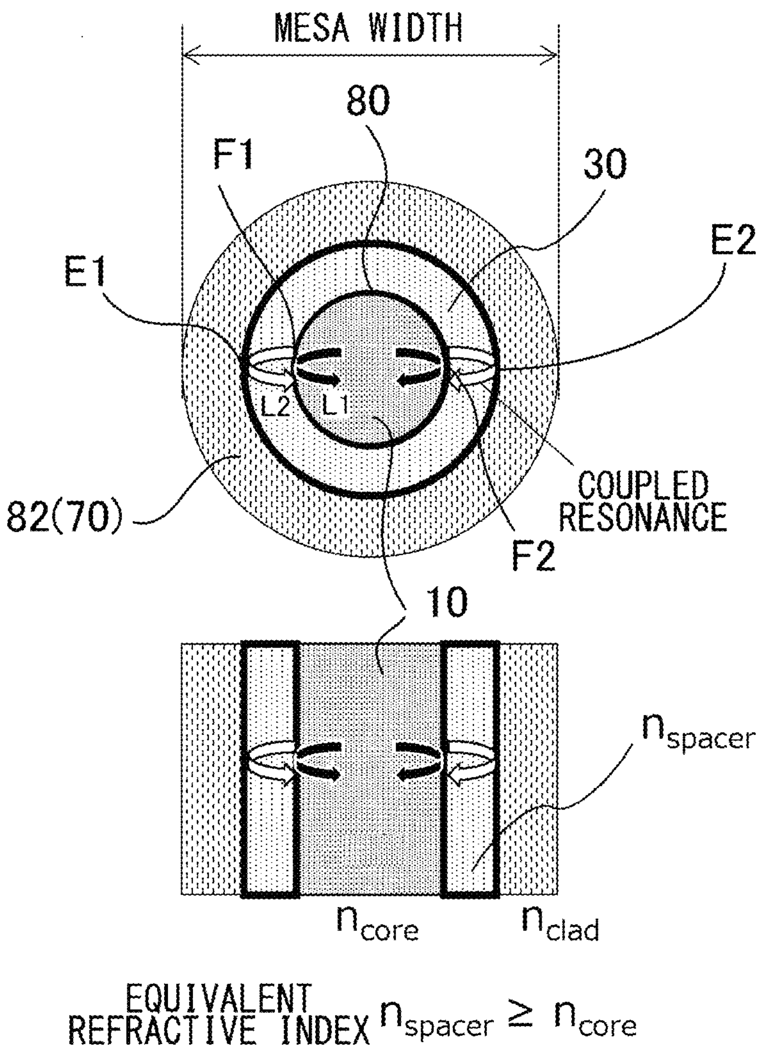
FIG. 23 shows a plane view and a cross-sectional view showing a surface emitting laser according to an example 5 of the embodiment 3.

FIG. 23 shows a plane view and a cross-sectional view of the surface emitting laser 1C according to an example (example 5) of the embodiment 3. The surface emitting laser 1C has a circular shape. In the main resonator 10, the light L1 that propagates in the radial direction (propagation in the transverse direction is shown for exemplary purposes in FIG. 23) is reflected at the end portions F1 and F2 of the circular-shaped aperture 80. Furthermore, the light L2 that leaks from the aperture 80 to a external resonator 30 is reflected by the end portions E1 and E2 of the optically discontinuous portion 82, and is fed back to the main resonator 10 of the aperture 80.

Directing attention to the light propagation in the transverse direction, by adjusting the equivalent refractive index of the oxide region such that it is larger than the equivalent refractive index of the oxide aperture region, this allows light to propagate in the transverse direction. This increases the reflection of light from the end portion of the optically discontinuous portion 82, and the light thus reflected is fed back to the main resonator 10. This allows light to be effectively fed back from the external resonator 30 to the main resonator 10.

Figure 24:
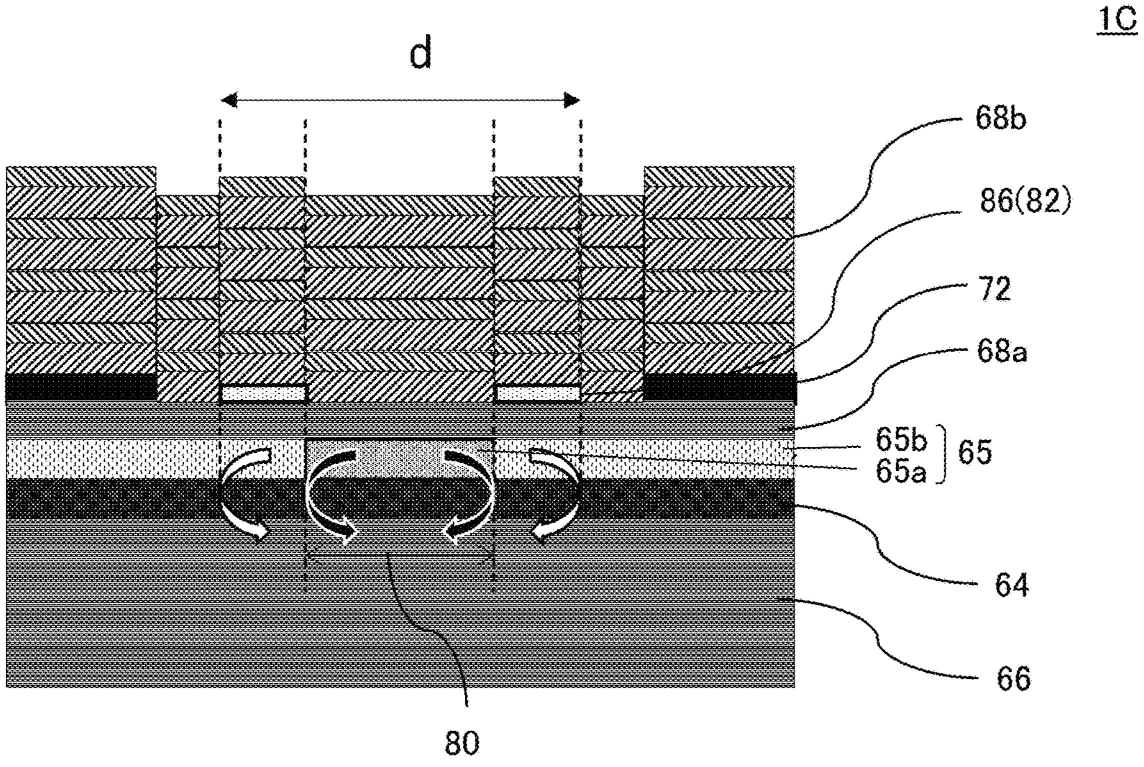
FIG. 24 is a cross-sectional diagram showing a surface emitting laser according to an example 6 of the embodiment 3.

FIG. 24 is a cross-sectional diagram showing the surface emitting laser 1C according to an example (example 6) of the embodiment 3. In this example 6, the distance between the p electrode 72 and the oxide aperture is 3 μm or more. Accordingly, the p-type electrode 72 does not function as the optically discontinuous portion 82. Instead, the optically discontinuous portion 82 is formed as a dielectric material (phase shift layer) 86. The dielectric material 86 is formed along the outer circumference of the aperture 80 in the current confinement structure such that it overlaps with the oxidation region 65*b*. By appropriately adjusting the thickness of the dielectric material 86, this allows the difference in the equivalent refractive index between the inner side and the outer side of the aperture 80 to be set to zero, or the magnitude relation of the equivalent refractive index between them to be reversed. This allows light to strongly leak to an external resonator. The dielectric material 86 is designed to have a thickness such that the equivalent refractive index of the oxidation region 65*b* is larger than the equivalent refractive index of the oxide aperture region. In the drawing, "d" represents the width of the outer circumference of the dielectric material 86. The dielectric material 86 is not restricted in particular. However, giving consideration to affinity with the semiconductor manufacturing process for the surface emitting laser 1C, $Ta_2O_5$, $SiO_2$, or $Si_xN_y$ are preferably employed. Also, the inner circumference of the dielectric material 86 and the boundary of the oxide aperture 80 are not necessarily required to coincide with each other.

Figure 25:
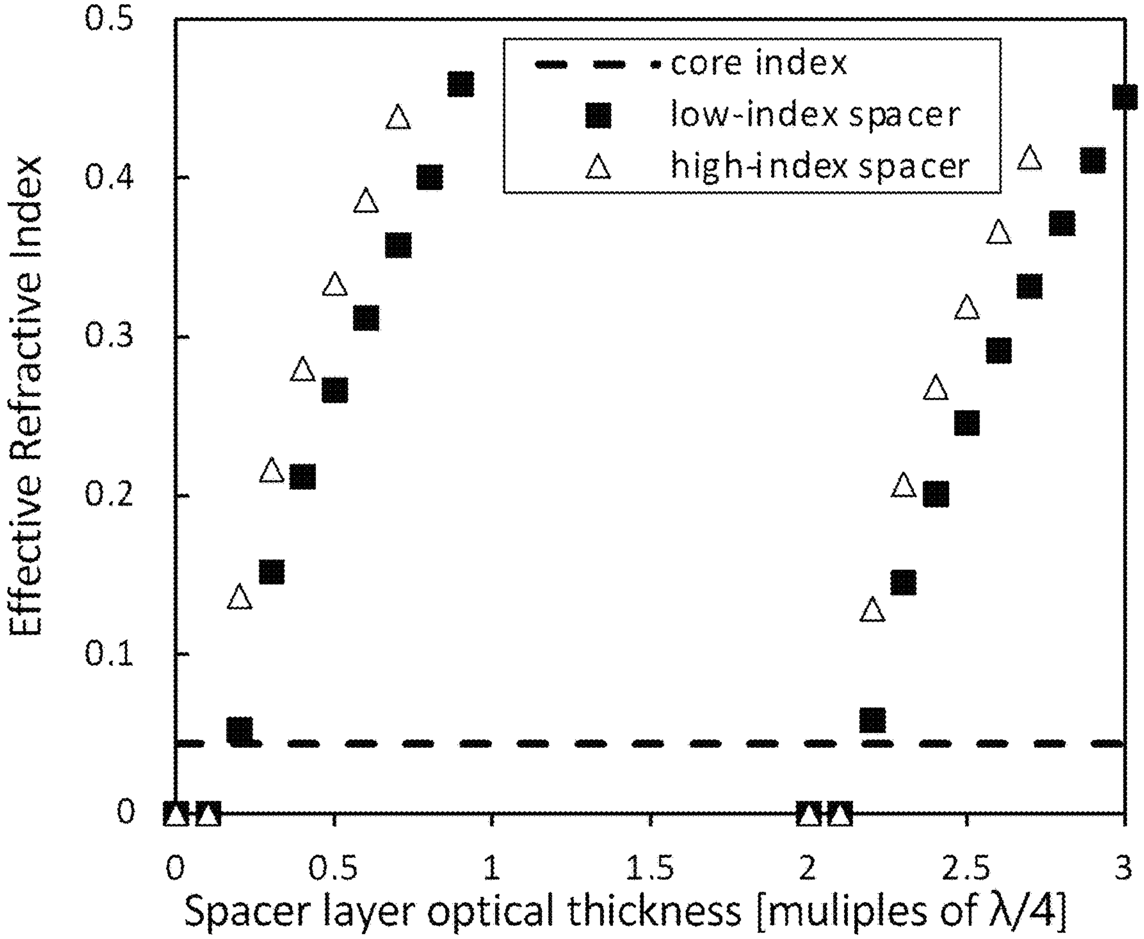
FIG. 25 is a diagram showing the relation between the dielectric spacer layer thickness and the equivalent refractive index of an oxidized region.

FIG. 25 is a diagram showing the relation between the thickness of the dielectric material 86 and the equivalent refractive index of the oxidation region. In the figure, the values indicated by the broken line represent the equivalent refractive index of the oxide aperture 80. When the equivalent refractive index of the oxide region exceeds that of the oxide aperture 80, evanescent light becomes propagating light. In the drawing, the triangular plots represent a case in which a $Ta_2O_5$ layer is provided as a high refractive layer. On the other hand, the square plots represent a case in which a $SiO_2$ layer is provided as a low refractive layer. In a case of inserting the high refractive layer configured as $Ta_2O_5$ layer with a thickness on the order of 0.1 of the (¼) optical wavelength, evanescent light becomes propagating light in the oxide region. In contrast, in a case of inserting the low refractive layer configured as a $SiO_2$ layer with a thickness on the order of 0.2 of the (¼) optical wavelength, evanescent light also becomes propagating light in the oxidation region.

Figure 26:
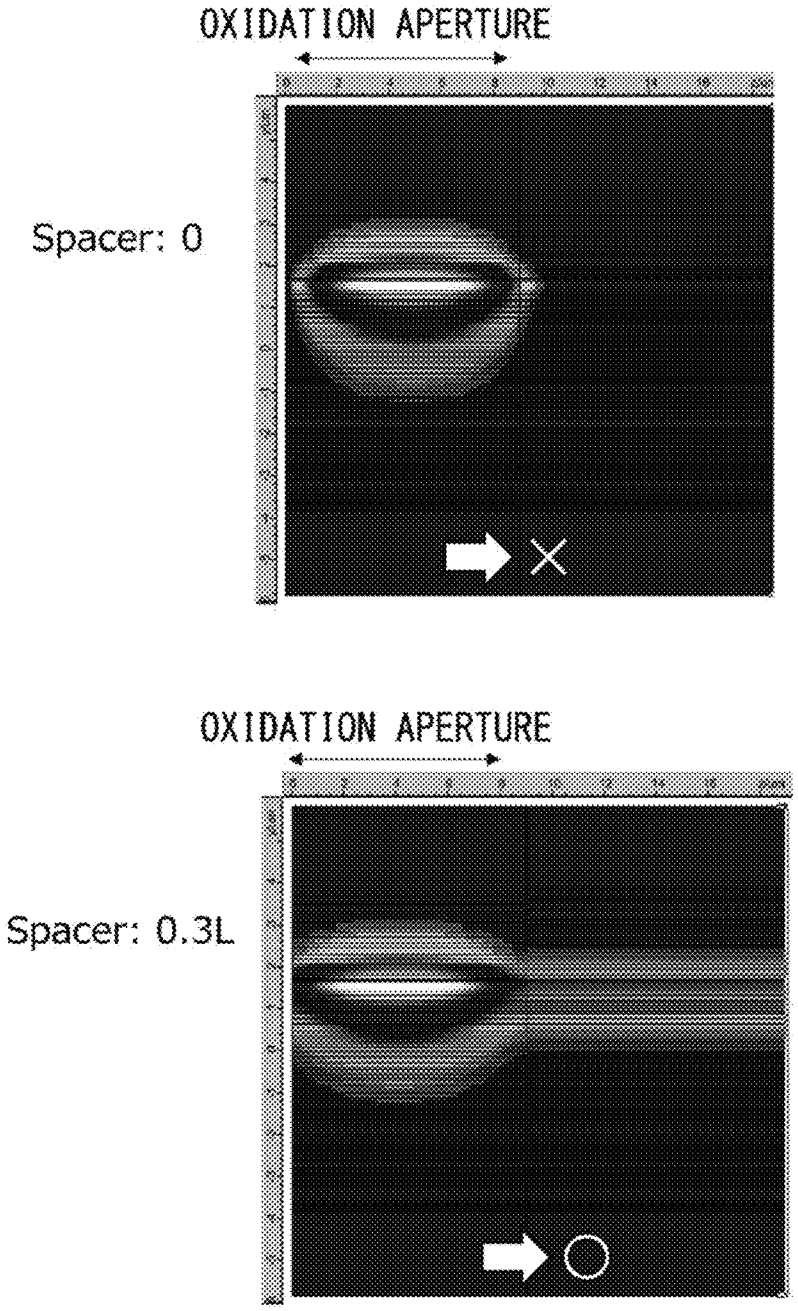
FIG. 26 is a diagram showing the electric field distributions in a case in which a low-refractive-index $SiO_2$ layer is not inserted as a spacer layer into the oxidized region and a case in which a low-refractive-index $SiO_2$ layer is inserted with a thickness of (quarter optical wavelength×0.3)

FIG. 26 is a diagram showing the electromagnetic field distributions in a case in which a low refractive layer configured as an $SiO_2$ layer is not inserted as the dielectric member 86 into the oxidation region and a case in which a low refractive layer configured as an $SiO_2$ layer is inserted with a thickness of (quarter optical wavelength×0.3) as the dielectric material 86 into the oxidation region. It can be understood that, in a case in which the dielectric material 86 is not inserted, there is almost no light propagation from the oxide aperture 80 to the oxide region.

Figure 27:
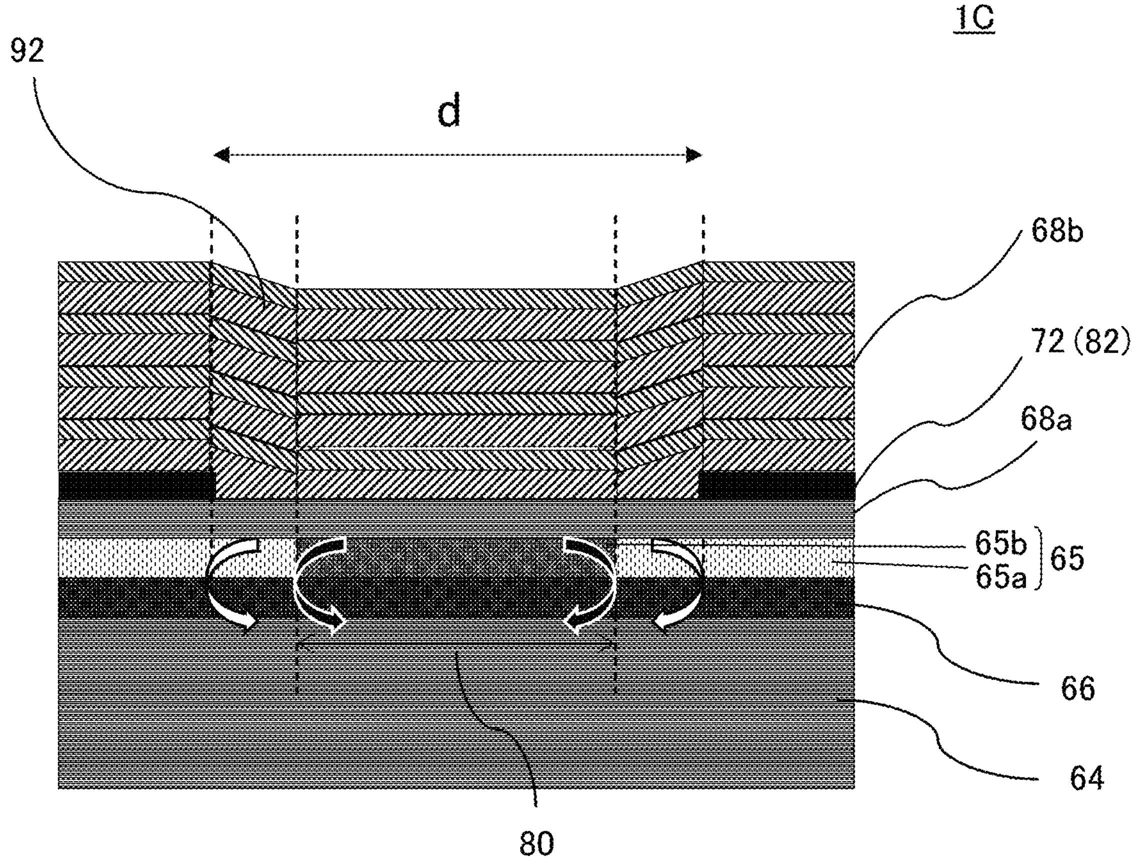
FIG. 27 is a cross-sectional diagram showing a surface emitting laser according to an example 7 of the embodiment 3.

FIG. 27 is a cross-sectional diagram showing the surface emitting laser 1C according to an example (example 7) of the embodiment 3. In the example 7, the distance between the p-type electrode 72 and the oxide aperture is set to be equal to or smaller than 3 μm. Here "d" represents the width of the metal aperture. When the dielectric multilayer film 68*b* is formed, the dielectric multilayer film 68*b* has a larger thickness at an edge portion 92 due to the edge effect, i.e., due to the step of the p electrode 72. This allows the oxide region to have an equivalent reflective index that is larger than that of the oxide aperture region. As a result, such an arrangement provides the same effect as that described in the example 6. In this example, the p-type electrode 72 functions as the optically discontinuous portion 82.

Figure 28:
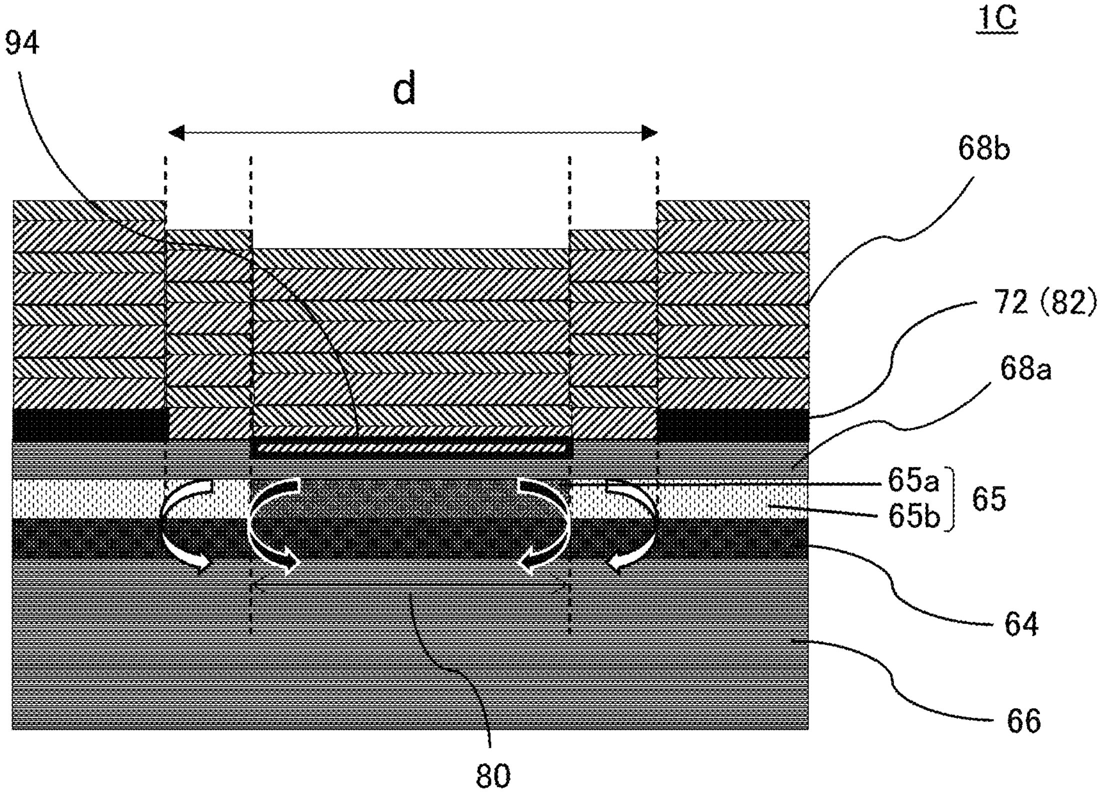
FIG. 28 is a cross-sectional diagram showing a surface emitting laser according to an example 8 of the embodiment 3.

FIG. 28 is a cross-sectional diagram showing the surface emitting laser 1C according to an example (example 8) of the embodiment 3. In the example 8, the distance between the p electrode 72 and the oxide aperture is set to be equal to or smaller than 3 μm. Here "d" represents the width of the metal aperture. A phase shift layer 94 is formed such that it overlaps with the region of the oxide aperture 80. For example, the phase shift layer 94 can be formed by etching the surface layer of the semiconductor DBR 68*a* of the oxide aperture 80. Even if the phase shift layer 94 is formed by etching with a small etching depth on the order of several nm that is much smaller than a pair of layers (two layers) of the DBR, this arrangement is effective. That is to say, the semiconductor DBR 68*a* in the aperture 80 region is configured to have a smaller thickness than that of the other portions thereof. The example 8 also provides the same effects as those provided by the examples 6 and 7. That is to say, with such an arrangement shown in FIG. 25 in which the oxide aperture 80 is configured to have a reduced equivalent refractive index, this relatively raises the equivalent refractive index of the oxide region. With this, in the oxide region, the evanescent light in the oxidation region becomes propagating light. With this arrangement, the p-type electrode 72 functions as the optically discontinuous portion 82.

Figure 29:
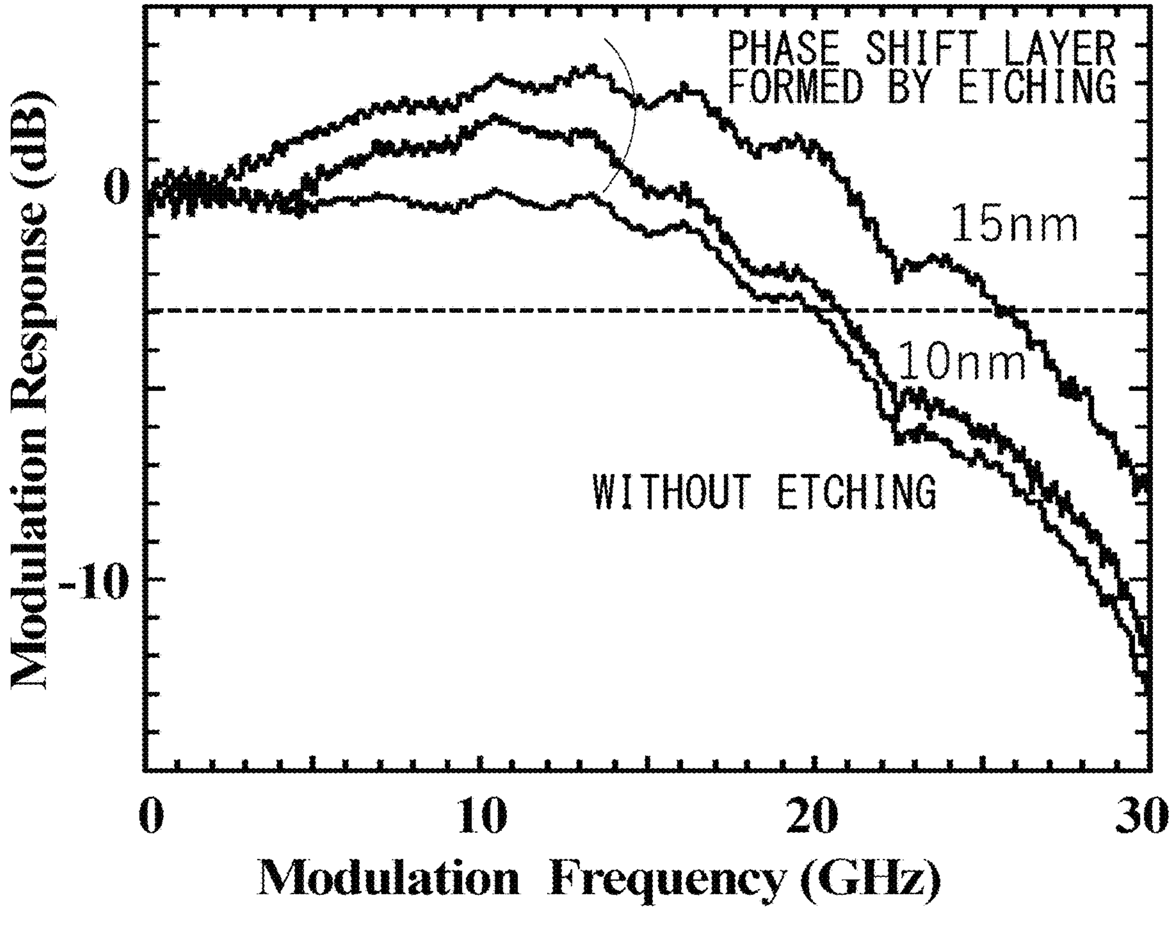
FIG. 29 is a diagram showing the measurement results of the modulation bandwidth of the surface emitting laser having the structure shown in FIG. 28.

FIG. 29 is a diagram showing the measurement results of the modulation bandwidth provided by a surface emitting laser having the structure shown in FIG. 28. Devices were each fabricated such that an oxide aperture (non-oxidation region) having a diameter of 6 μm was formed, and an electrode having an aperture diameter of 10 μm was formed along the outer circumference of the oxide aperture. Furthermore, a device was processed such that the surface of the oxide aperture region was etched with a depth of 10 nm. Moreover, another device was processed such that the oxide aperture region was etched with a depth of 15 nm. Subsequently, comparison was made between the devices thus subjected to etching and a device without etching. With such an arrangement in which the oxide aperture region is etched, this provides a modulation bandwidth that is increased from 20 GHz to 25 GHz.

In the embodiment 3, the number of the optically discontinuous portions 82 is not restricted in particular. That is to say, the number of the optically discontinuous portions 82 may be one, or may be three or more.

Description has been made regarding the present disclosure with reference to the embodiments using specific terms. However, the above-described embodiments show only the mechanisms and applications of the present disclosure. Rather, various modifications and various changes in the layout can be made without departing from the spirit and scope of the present disclosure defined in appended claims.

What is claimed is:

1. A surface emitting laser comprising:

a Vertical-Cavity Surface Emitting Laser (VCSEL) structure having:

a top Distributed Bragg Reflector (DBR); and an oxide aperture provided by a current confinement structure and formed by selective oxidation; and an optically discontinuous portion formed in the top DBR, wherein the optically discontinuous portion is disposed spaced apart from the oxide aperture in a plan view of the surface-emitting laser, and wherein the top DBR comprises a multilayer structure including a semiconductor DBR and a dielectric DBR, a bottom surface of the optically discontinuous portion is physically in contact with the semiconductor DBR, and a top surface and a side surface of the optically discontinuous portion is physically in contact with the dielectric DBR, wherein a portion of the semiconductor DBR which overlaps with the oxide aperture has a thickness that is smaller than that of the other portions of the semiconductor DBR.

2. The surface emitting laser according to claim 1, wherein a distance between a side of the oxide aperture and the side of the optically discontinuous portion is shorter than 3 μm.

3. The surface emitting laser according to claim 1, wherein the distance between the side of the oxide aperture and the side of the optically discontinuous portion is equal to or smaller than 2 μm.

4. The surface emitting laser according to claim 1, wherein the optically discontinuous portion comprises a dielectric material formed along an outer circumference of the oxide aperture such that the dielectric material overlaps with an oxide region of the current confinement structure.

5. The surface emitting laser according to claim 1, wherein the optically discontinuous portion is formed of a metal material.

6. The surface emitting laser according to claim 5, wherein the optically discontinuous portion is structured as a p-type electrode for injecting a current to the VCSEL structure.

7. The surface emitting laser according to claim 1, wherein the optically discontinuous portion is formed of a dielectric material.

8. The surface emitting laser according to claim 7, wherein the optically discontinuous portion is formed of $Ta_2O_5$.

9. The surface emitting laser according to claim 1, wherein the optically discontinuous portion is formed of a semiconductor material.

10. The surface emitting laser according to claim 9, wherein the semiconductor material is GaAs or Si.

11. The surface emitting laser according to claim 1, wherein the optically discontinuous portion is formed at a boundary between the semiconductor DBR and the dielectric DBR.

12. The surface emitting laser according to claim 1, wherein the optically discontinuous portion is structured as an oxidation layer.

13. The surface emitting laser according to claim 12, wherein the VCSEL structure comprises a first oxidation current confinement layer in which the oxide aperture is formed, and a second oxidation current confinement layer formed above the first oxidation current confinement layer, and wherein the optically discontinuous portion is formed in the second oxidation current confinement layer.

14. The surface emitting laser according to claim 1, wherein a plurality of the optically discontinuous portions are formed in different transverse directions with respect to the oxide aperture.

15. A surface emitting laser comprising:

a Vertical-Cavity Surface emitting laser (VCSEL) structure having:

a top Distributed Bragg Reflector (DBR); and an oxide aperture provided by a current confinement structure and formed by selective oxidation; and an optically discontinuous portion formed in the top DBR, wherein, in a plan view of the surface-emitting laser, the optically discontinuous portion is arranged in a region spaced apart from the oxide aperture with a gap therebetween such that the optically discontinuous portion reflects a slow light towards the oxide aperture, the top DBR comprises a multilayer structure including a semiconductor DBR and a dielectric DBR, and a top surface and a side surface of the optically discontinuous portion is physically in contact with the dielectric DBR, in a plan view of the surface emitting laser, a portion in which the oxide aperture is formed constitutes a main resonator, and a region sandwiched between the oxide aperture and the optically discontinuous portion constitutes an external resonator, wherein the optically discontinuous portion is arranged so as to reflect slow light propagating through the external resonator toward the main resonator, and wherein a portion of the semiconductor DBR which overlaps the oxide aperture has a thickness that is smaller than that of the other portions of the semiconductor DBR.

16. The surface emitting laser according to claim 15, wherein the optically discontinuous portion comprises a dielectric member formed along an outer circumference of the oxide aperture such that the dielectric member overlaps an oxidation region of the current confinement structure.

17. The surface emitting laser according to claim 15, wherein the optically discontinuous member is formed of a dielectric material.

* * * * *